(12) United States Patent
Volkovich et al.

(10) Patent No.: US 11,075,126 B2
(45) Date of Patent: Jul. 27, 2021

(54) MISREGISTRATION MEASUREMENTS USING COMBINED OPTICAL AND ELECTRON BEAM TECHNOLOGY

(71) Applicant: KLA-TENCOR CORPORATION, Milpitas, CA (US)

(72) Inventors: Roie Volkovich, Migdal Ha'emek (IL); Liran Yerushalmi, Zicron Yaacob (IL); Nadav Gutman, Zichron Ya'aqov (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 16/477,552

(22) PCT Filed: Jun. 4, 2019

(86) PCT No.: PCT/US2019/035282
§ 371 (c)(1),
(2) Date: Jul. 12, 2019

(87) PCT Pub. No.: WO2020/167331
PCT Pub. Date: Aug. 20, 2020

(65) Prior Publication Data
US 2020/0266112 A1    Aug. 20, 2020

Related U.S. Application Data

(60) Provisional application No. 62/806,226, filed on Feb. 15, 2019.

(51) Int. Cl.
*H01L 21/66* (2006.01)
*H01L 21/67* (2006.01)

(52) U.S. Cl.
CPC ........ *H01L 22/12* (2013.01); *H01L 21/67259* (2013.01)

(58) Field of Classification Search
CPC ................................ H01L 22/12; H01L 21/67
See application file for complete search history.

(56) References Cited

U.S. PATENT DOCUMENTS

| 6,678,038 B2 * | 1/2004 | Binnard | G03F 7/70616 |
| | | | 355/53 |
| 7,138,629 B2 * | 11/2006 | Noji | G01N 23/225 |
| | | | 250/311 |

(Continued)

FOREIGN PATENT DOCUMENTS

JP    2011155119 A    8/2011

OTHER PUBLICATIONS

WIPO, ISR for International Application No. PCT/US2019/035282, Nov. 14, 2019.

*Primary Examiner* — William Coleman
(74) *Attorney, Agent, or Firm* — Hodgson Russ LLP

(57) ABSTRACT

A misregistration metrology system useful in manufacturing semiconductor device wafers including an optical misregistration metrology tool configured to measure misregistration at at least one target between two layers of a semiconductor device which is selected from a batch of semiconductor device wafers which are intended to be identical, an electron beam misregistration metrology tool configured to measure misregistration at the at least one target between two layers of a semiconductor device which is selected from the batch and a combiner operative to combine outputs of the optical misregistration metrology tool and the electron beam misregistration metrology tool to provide a combined misregistration metric.

20 Claims, 16 Drawing Sheets

(56) References Cited

U.S. PATENT DOCUMENTS

| | | | |
|---|---|---|---|
| 7,317,531 B2 * | 1/2008 | Mieher | G03F 9/7049 |
| | | | 356/401 |
| 8,330,281 B2 * | 12/2012 | Ghinovker | G06T 7/33 |
| | | | 257/797 |
| 8,674,301 B2 * | 3/2014 | Takagi | G02B 21/365 |
| | | | 250/307 |
| 9,093,458 B2 | 7/2015 | Amir et al. | |
| 10,268,124 B2 * | 4/2019 | Den Boef | G01B 11/26 |
| 2003/0156276 A1 | 8/2003 | Bowes | |
| 2006/0098199 A1 | 5/2006 | Nikoonahad et al. | |
| 2008/0157404 A1 | 7/2008 | Fried et al. | |
| 2008/0180646 A1 * | 7/2008 | Colburn | B82Y 40/00 |
| | | | 355/46 |
| 2013/0314710 A1 | 11/2013 | Levy et al. | |
| 2019/0178639 A1 | 6/2019 | Gutman et al. | |
| 2020/0124989 A1 * | 4/2020 | Ten Berge | G03F 1/74 |

\* cited by examiner

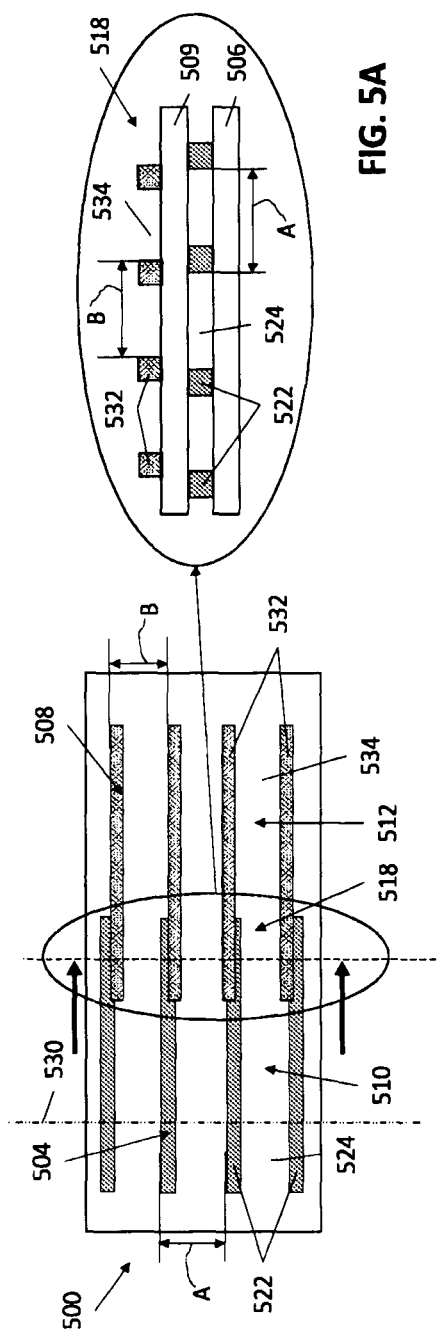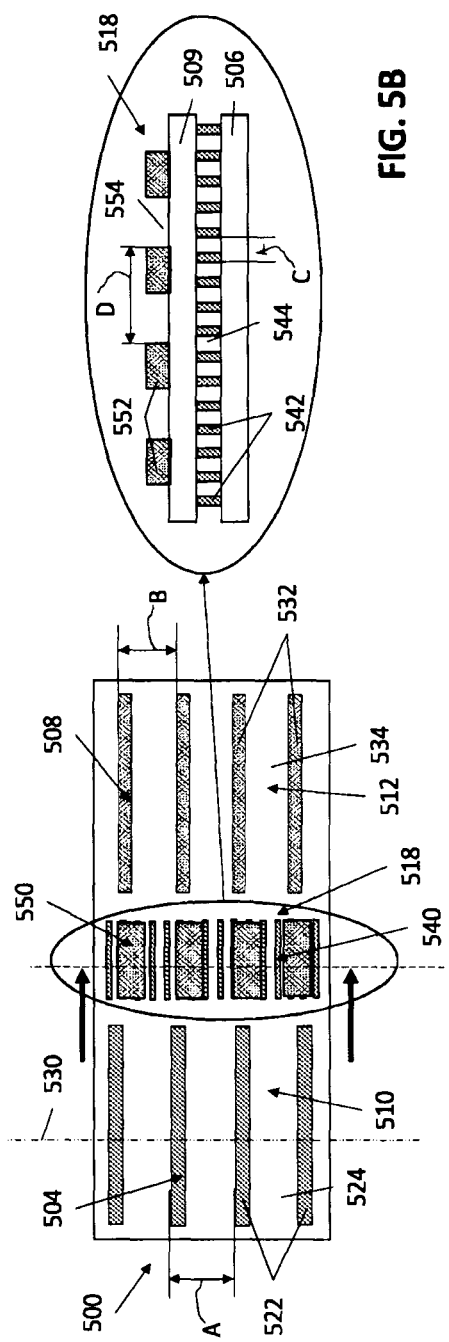

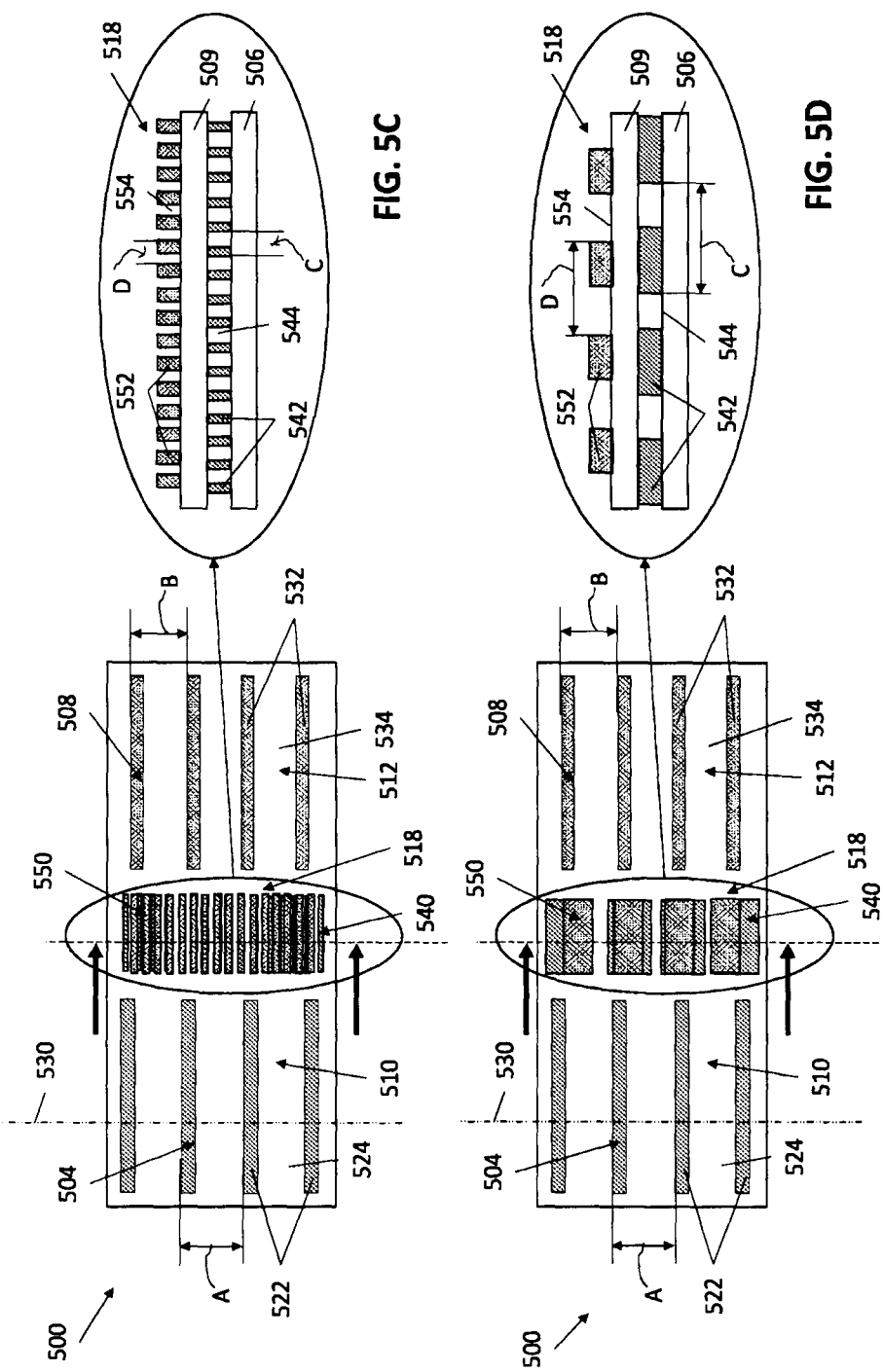

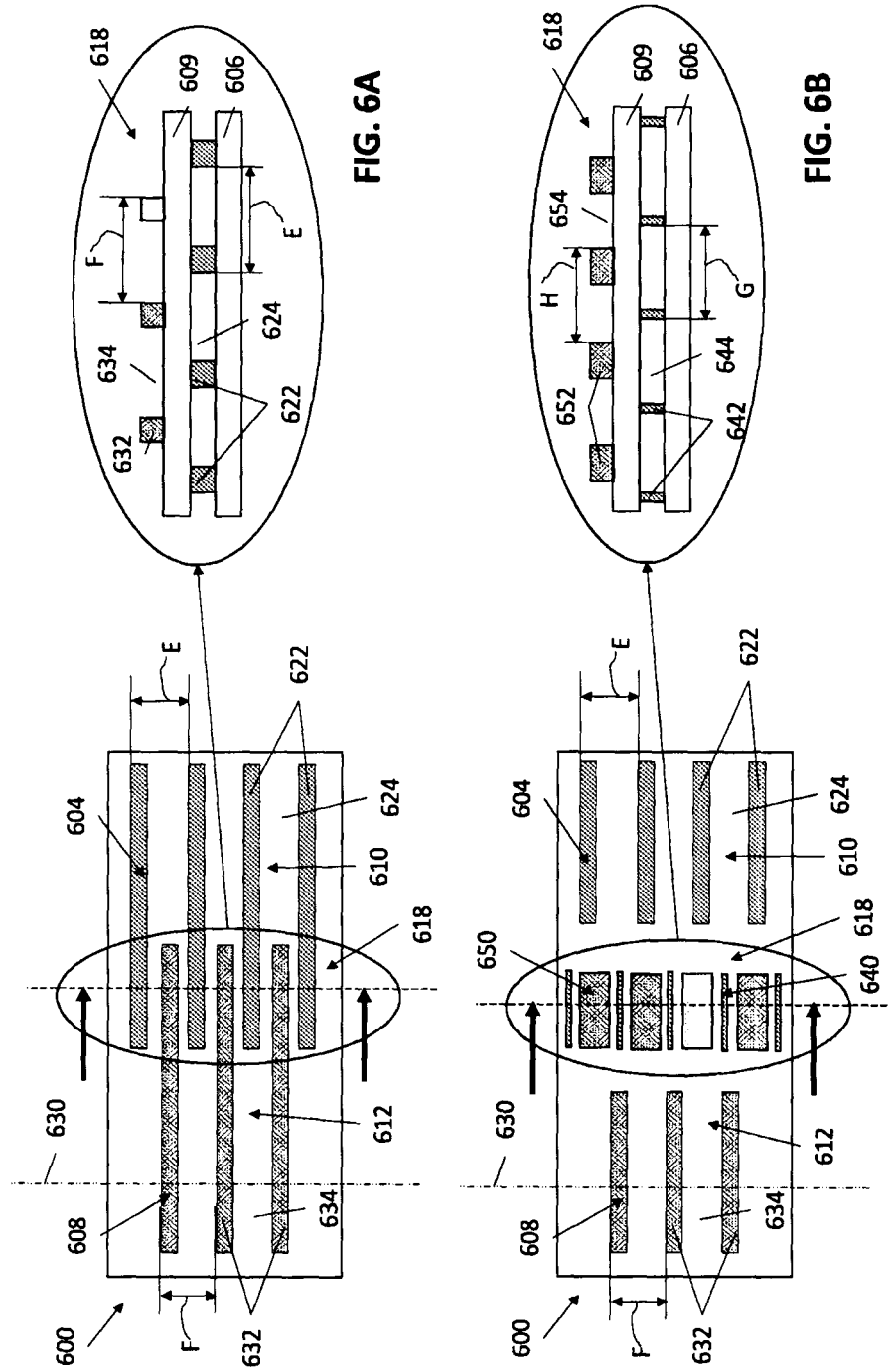

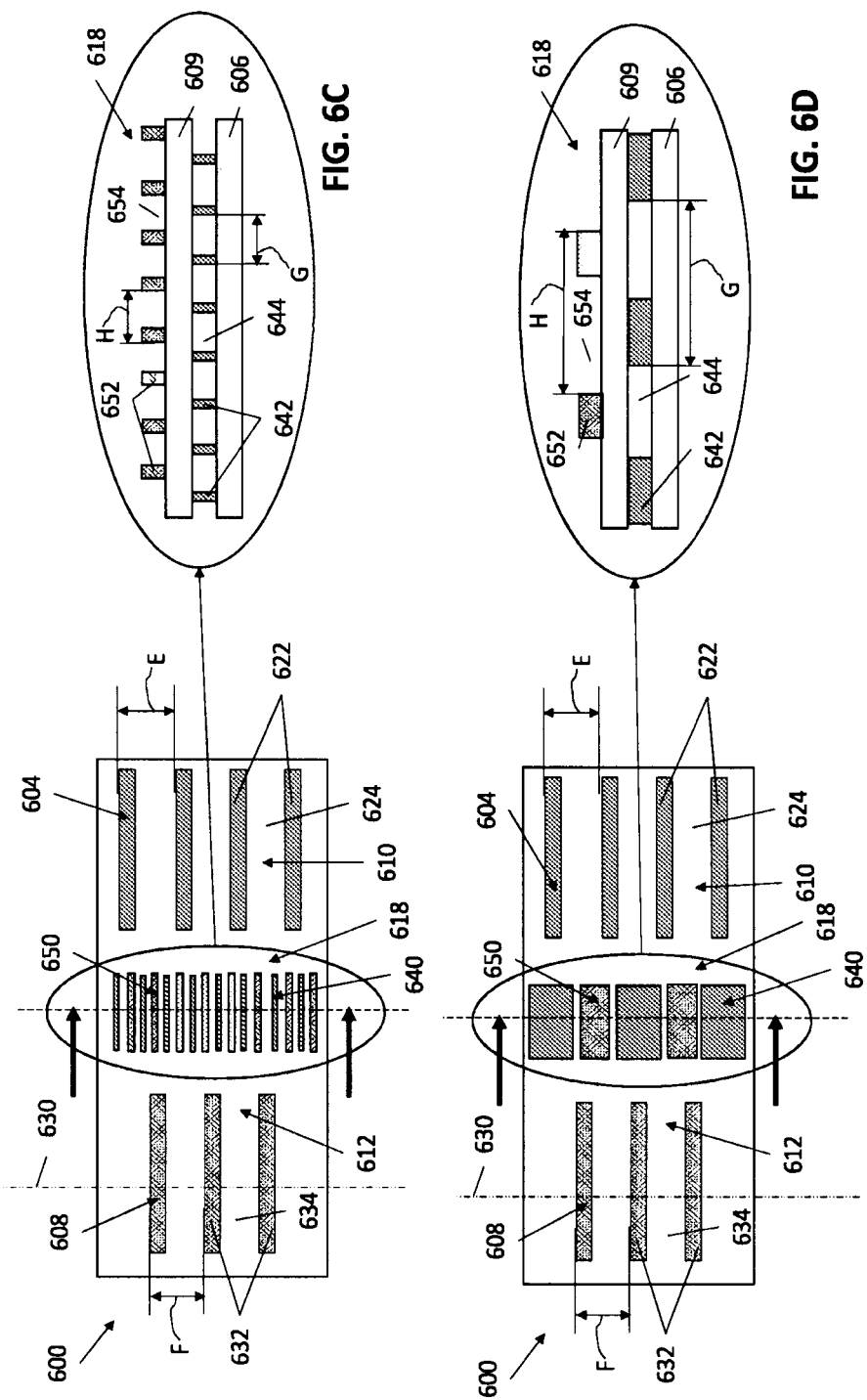

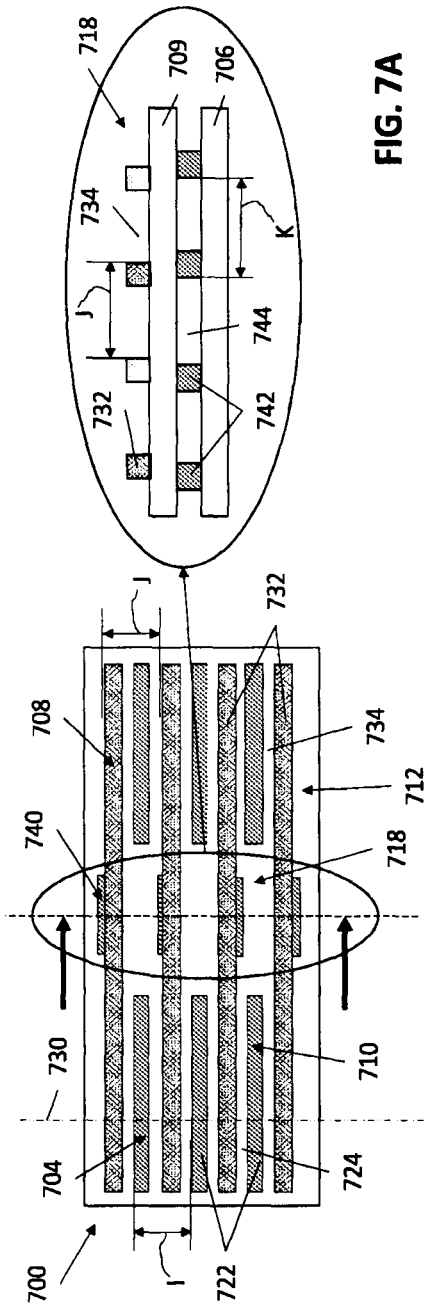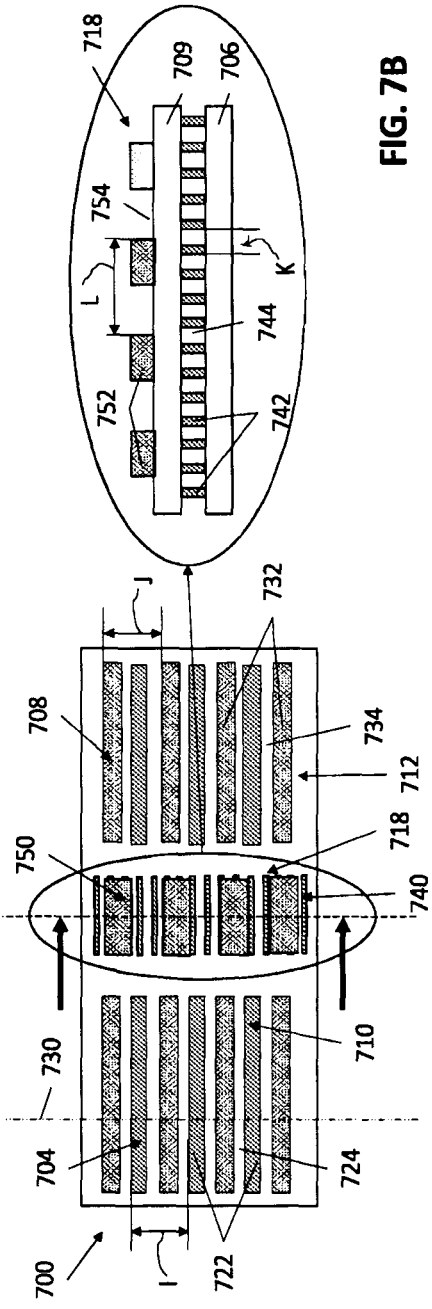
FIG. 7A
FIG. 7B

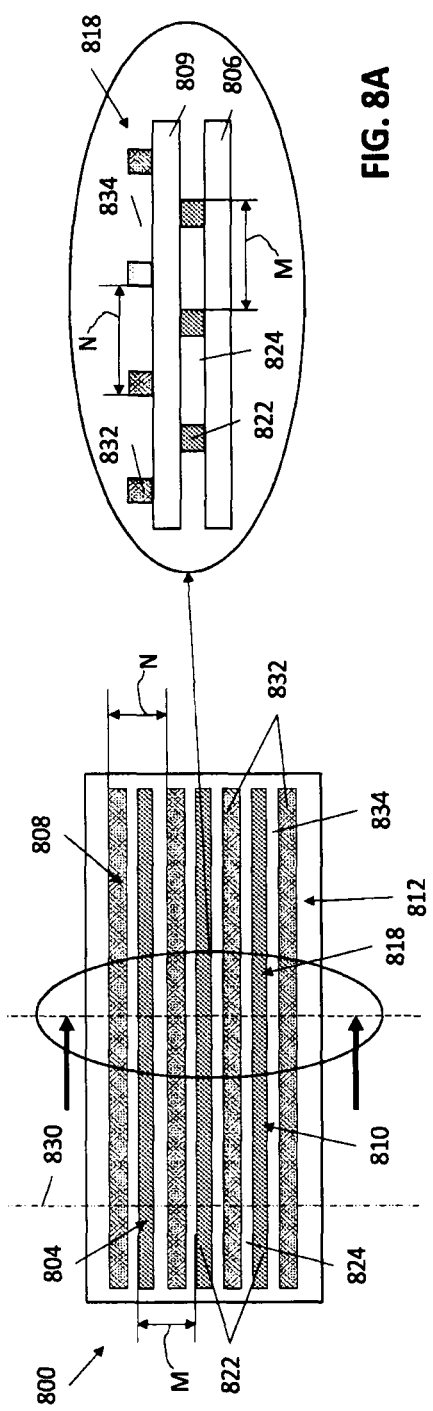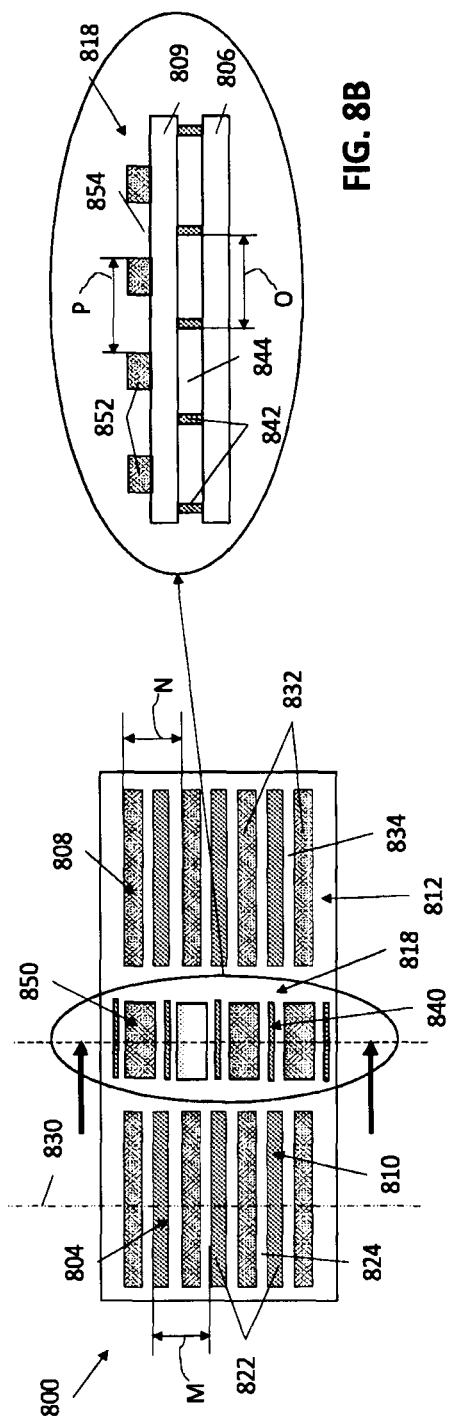

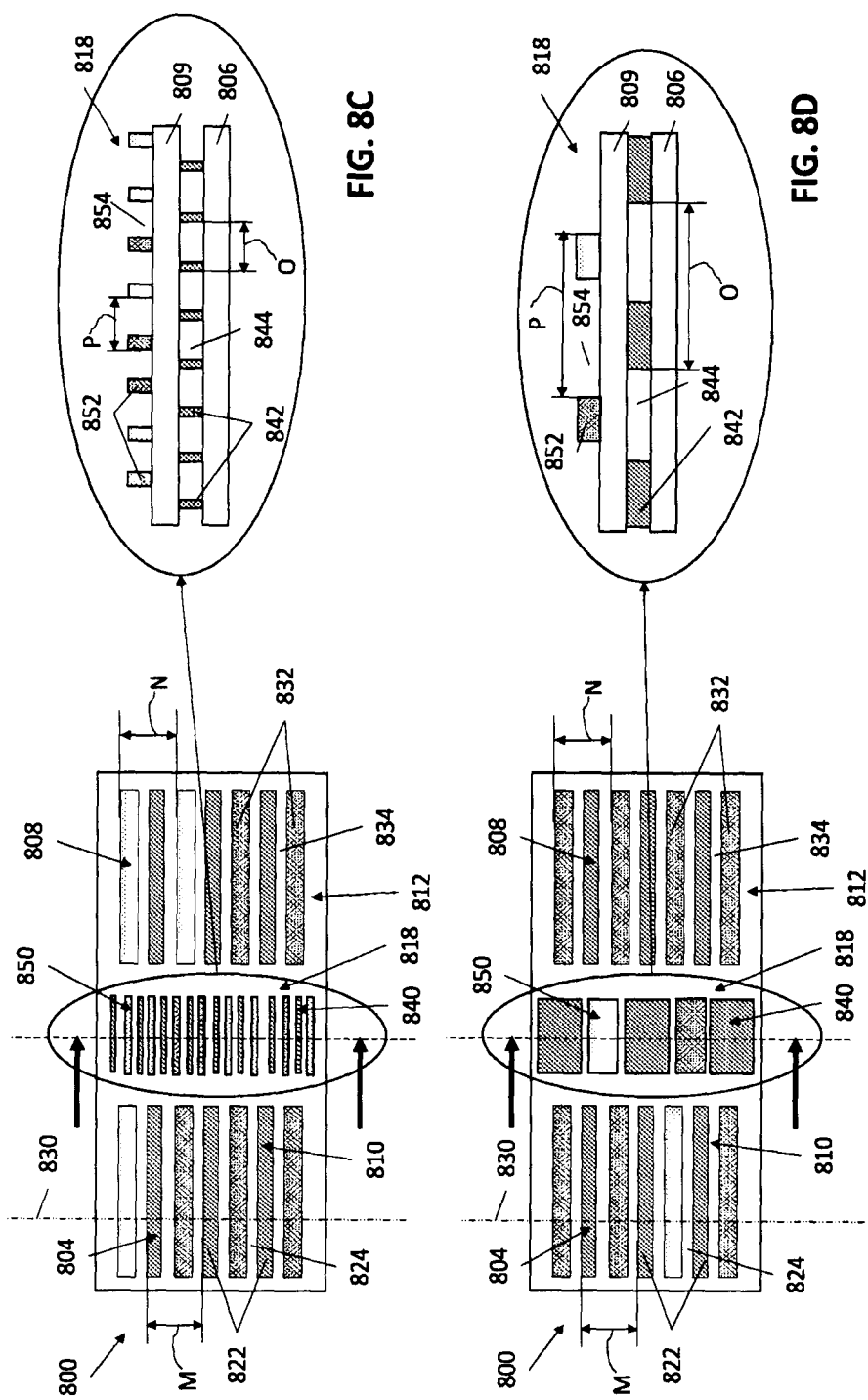

MISREGISTRATION MEASUREMENTS USING COMBINED OPTICAL AND ELECTRON BEAM TECHNOLOGY

REFERENCE TO RELATED APPLICATIONS

Reference is made to U.S. Provisional Patent Application Ser. No. 62/806,226, filed Feb. 15, 2019, and entitled NOVEL APPROACH FOR ACCURATE OVL USING COMBINE OPTICAL AND EBEAM TECHNOLOGY, the disclosure of which is hereby incorporated by reference and priority of which is hereby claimed.

Reference is also made to the following patents and patent applications, which are related to the subject matter of the present application, the disclosures of which are hereby incorporated by reference:

Applicant's U.S. patent application Ser. No. 15/979,336 entitled OVERLAY MEASUREMENTS OF OVERLAPPING TARGET STRUCTURES BASED ON SYMMETRY OF SCANNING ELECTRON BEAM SIGNALS and filed May 14, 2018;

Applicant's U.S. Pat. No. 9,093,458 entitled DEVICE CORRELATED METROLOGY (DCM) FOR OVL WITH EMBEDDED SEM STRUCTURE OVERLAY TARGETS and issued on Jul. 28, 2015;

Applicant's U.S. Pat. No. 8,330,281 entitled OVERLAY MARKS, METHODS OF OVERLAY MARK DESIGN AND METHODS OF OVERLAY MEASUREMENTS and issued on Dec. 11, 2012; and Applicant's U.S. Pat. No. 7,317,531 entitled APPARATUS AND METHODS FOR DETECTING OVERLAY ERRORS USING SCATTEROMETRY and issued on Jan. 8, 2008.

FIELD OF THE INVENTION

The present invention relates to the field of metrology, and more particularly, to misregistration metrology procedures.

BACKGROUND OF THE INVENTION

Various types of devices for metrology and misregistration metrology procedures are known.

SUMMARY OF THE INVENTION

The present invention seeks to provide improved misregistration measurement systems and methods.

There is thus provided, in accordance with a preferred embodiment of the present invention a misregistration metrology system useful in manufacturing semiconductor device wafers including an optical misregistration metrology tool configured to measure misregistration at at least one target between two layers of a semiconductor device which is selected from a batch of semiconductor device wafers which are intended to be identical, an electron beam misregistration metrology tool configured to measure misregistration at the at least one target between two layers of a semiconductor device which is selected from the batch and a combiner operative to combine outputs of the optical misregistration metrology tool and the electron beam misregistration metrology tool to provide a combined misregistration metric.

Preferably the optical misregistration metrology tool includes a scatterometry metrology tool. Alternatively, the optical misregistration metrology tool includes an imaging metrology tool.

In accordance with a preferred embodiment of the present invention the optical misregistration metrology tool and the electron beam misregistration metrology tool each measure misregistration between two layers of a single semiconductor device. Alternatively, the optical misregistration metrology tool and the electron beam misregistration metrology tool each measure misregistration between two layers of different semiconductor device wafers which are both selected from the batch.

There is also provided in accordance with another preferred embodiment of the present invention a method for manufacturing semiconductor device wafers including performing at least an initial stage in a lithography process on at least one semiconductor device wafer which is selected from a batch of semiconductor device wafers, which are intended to be identical, thereafter measuring misregistration of at least two layers of at least one semiconductor device wafer, which is selected from the batch of semiconductor device wafers, which are intended to be identical by employing an optical misregistration metrology tool to measure misregistration at at least one target between the two layers of at least one of the at least one semiconductor device wafers, which is selected from the batch of semiconductor device wafers which are intended to be identical, employing an electron beam misregistration metrology tool to measure misregistration at the at least one target between two layer of at least one of the at least one semiconductor device wafers which is selected from the batch of semiconductor device wafers which are intended to be identical and combining outputs of the optical misregistration metrology tool and the electron beam misregistration metrology tool to provide a combined misregistration metric and utilizing the combined misregistration metric for adjusting the lithography process to provide an adjusted lithography process.

In accordance with a preferred embodiment of the present invention the measuring misregistration includes employing the optical misregistration metrology tool and the electron beam misregistration metrology tool to measure misregistration between two layers of a single semiconductor device. Alternatively, the measuring misregistration includes employing the optical misregistration metrology tool and the electron beam misregistration metrology tool to measure misregistration between two layers of different semiconductor device wafers which are both selected from the batch.

In accordance with a preferred embodiment of the present invention the adjusted lithography process includes the initial stage in the lithography process. Additionally, the method also includes performing lithography rework using the adjusted lithography process.

Preferably, the adjusted lithography process includes a stage in the lithography process different from the initial stage in the lithography process.

In accordance with a preferred embodiment of the present invention the method also includes performing lithography using the adjusted lithography process on additional semiconductor device wafers which have a configuration which is intended to be identical to that of the semiconductor device.

In accordance with a preferred embodiment of the present invention the method also includes utilizing the combined misregistration metric for adjusting at least one of measurement parameters and results of the optical misregistration metrology tool. Additionally or alternatively, the method also includes utilizing the combined misregistration metric for adjusting at least one of measurement parameters and results of the electron beam misregistration metrology tool.

In accordance with a preferred embodiment of the present invention the optical misregistration metrology tool includes a scatterometry metrology tool. Alternatively or additionally, the optical misregistration metrology tool includes an imaging metrology tool.

Preferably, the performing at least an initial stage in a lithography process on at least one semiconductor device wafer includes performing a lithography process on at least one semiconductor device which is selected from a batch of semiconductor device wafers, which are intended to be identical, thereafter measuring post-lithography misregistration of at least two layers of at least one semiconductor device which is selected from the batch of semiconductor device wafers which are intended to be identical and thereafter performing an etching process on at, least one semiconductor device which is selected from the batch of semiconductor device wafers which are intended to be identical.

Preferably, the measuring misregistration includes employing the optical misregistration metrology tool and the electron beam misregistration metrology tool to measure misregistration between two layers of a single semiconductor device. Alternatively, the measuring misregistration includes employing the optical misregistration metrology tool and the electron beam misregistration metrology tool to measure misregistration between two layers of different semiconductor device wafers which are both selected from the batch.

In accordance with a preferred embodiment of the present invention the method also includes performing lithography using the adjusted lithography process on additional semiconductor device wafers which have a configuration which is intended to be identical to that of the semiconductor device.

In accordance with a preferred embodiment of the present invention the optical misregistration metrology tool includes a scatterometry metrology tool. Alternatively, the optical misregistration metrology tool includes an imaging metrology tool.

Preferably, the method also includes utilizing the combined misregistration metric for adjusting at least one of measurement parameters and results of the measuring post-lithography misregistration. Additionally or alternatively, the method also includes utilizing the combined misregistration metric for adjusting at least one of measurement parameters and results of the optical misregistration metrology tool. Alternatively or additionally, the method also includes utilizing the combined misregistration metric for adjusting at least one of measurement parameters and results of the electron beam misregistration metrology tool.

In accordance with a preferred embodiment of the present invention the measuring post-lithography misregistration includes employing an optical misregistration metrology tool to measure misregistration at at least one target between two layers of at least one of the at least one semiconductor device wafers which is selected from the batch of semiconductor device wafers which are intended to be identical. Additionally or alternatively, the measuring post-lithography misregistration includes employing an electron beam misregistration metrology tool to measure misregistration at at least one target between two layers of at least one of the at least one semiconductor device waters which is selected from the batch of semiconductor device wafers which are intended to be identical. Alternatively or additionally, the measuring post-lithography misregistration includes employing a post-lithography optical misregistration metrology tool to measure misregistration at at least one target between two layers of at least one of the at least one semiconductor device wafers which is selected from the batch of semiconductor device wafers which are intended to be identical, employing a post-lithography electron beam misregistration metrology tool to measure misregistration at the at least one target between the two layers of at least one of the at least one semiconductor device wafer's which is selected from the batch of semiconductor device wafers which are intended to be identical and combining outputs of the post-lithography optical misregistration metrology tool and the post-lithography electron beam misregistration metrology tool to provide a combined misregistration metric.

There is further provided in accordance with yet another preferred, embodiment of the present invention a target for use in measurement of misregistration in the manufacture of semiconductor devices, the target including a first periodic structure formed on a first layer of a semiconductor device; having a first pitch along an axis and a second periodic structure formed on a second layer of the semiconductor device and having a second pitch along an axis parallel to the axis, the target being characterized in that it includes at least one first region which is particularly suitable for optical metrology and at least one second region, separate from the at least first region, which is particularly suitable for electron beam metrology.

Preferably, in at least one portion of the at least one first region the first periodic structure is present and the second periodic structure is not present. Additionally or alternatively, in at least one second portion of the at least one first region the first periodic structure is not present and the second periodic structure is present.

In accordance with a preened embodiment of the present invention in the at least one second region both the first periodic structure and the second periodic structure are present.

In accordance with a preferred embodiment of the present invention in the at least one second region a third periodic, structure and a fourth periodic structure are present. Alternatively, in the at least one second region one of the first and second periodic structures are present and a third periodic structure is present.

In accordance with a preferred embodiment of the present invention in the at least one second region, the first periodic structure and the second periodic structure are partially overlapping. Additionally or alternatively, in the at least one second region, the third periodic structure and the fourth periodic structure are partially overlapping.

Preferably, in the at least one second region, the one of the first and second periodic structures and the third periodic structure are partially overlapping.

In accordance with a preferred embodiment of the present invention different parts of the first periodic structure and the second periodic structure are partially overlapping by different extents.

In accordance with a preferred embodiment of the present invention different parts of the third periodic structure and the fourth periodic structure are partially overlapping by different extents.

In accordance with a preferred embodiment of the present invention different parts of the one of the first and second periodic structures and the third periodic structure are partially overlapping by different extents.

Preferably, at least one of the first and second periodic structures includes plural periodic substructures. Additionally or alternatively, at least one of the third and fourth periodic structures includes plural periodic substructures.

In accordance with a preferred embodiment of the present invention in the at least one second region, the first periodic structure and the second periodic structure are non-overlapping.

In accordance with a preferred embodiment of the present invention in the at least one second region, the third periodic structure and the fourth periodic structure are non-overlapping.

BRIEF DESCRIPTION OF THE DRAWINGS

The present invention will be understood and appreciated more fully from the following detailed description, taken in conjunction with the drawings in which:

FIGS. 5A-5D are simplified illustrations showing four alternative embodiments of a first hybrid target useful in conjunction with the methods for manufacturing semiconductor device wafers of FIGS. 1A-4B;

FIGS. 6A-6D are simplified illustrations showing four alternative embodiments of a second hybrid target useful in conjunction with the methods for manufacturing semiconductor device wafers of FIGS. 1A-4B;

FIGS. 7A-7D are simplified illustrations showing four alternative embodiments of a third hybrid target useful in conjunction with the methods for manufacturing semiconductor device wafers of FIGS. 1A-4B; and FIGS. 8A-8D are simplified illustrations showing four alternative embodiments of a fourth hybrid target useful in conjunction with the methods for manufacturing semiconductor device wafers of FIGS. 1A-4B.

DETAILED DESCRIPTION OF PREFERRED EMBODIMENTS

Figure 1A:
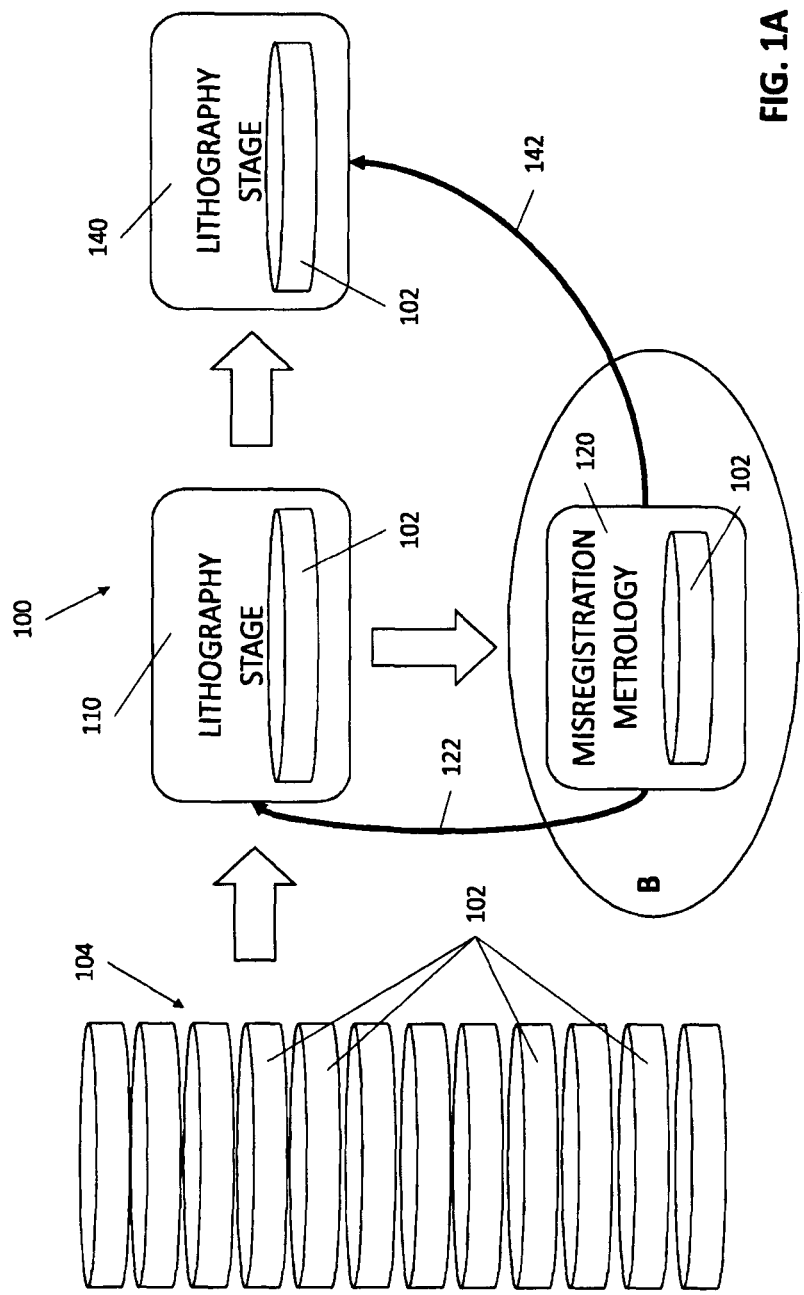
FIG. 1A is a simplified schematic pictorial illustration of a first method for manufacturing semiconductor device wafers.

Reference is now made to FIG. 1A, which is a simplified schematic drawing of a first method 100 for manufacturing semiconductor device wafers. As seen in FIG. 1A, at least one semiconductor device wafer 102, selected from a batch of semiconductor device wafers which are intended to be identical (BSDWII) 104, is patterned at a first lithography stage 110, is appreciated that although BSDWII 104 is drawn with twelve semiconductor device wafers 102, BSDWII 104 may include any number of semiconductor device wafers 102 that is greater than or equal to one.

After patterning at first lithography stage 110, misregistration of at least two layers of semiconductor device wafer 102 are optionally measured by a misregistration metrology system 120, and, as indicated by an arrow 122, results from measurement by misregistration metrology system 120 may be sent to first lithography stage 110 for patterning either of additional ones of semiconductor device wafers 102 selected from BSDWII 104 or re-patterning of semiconductor device wafer 102 that had been previously patterned. It is appreciated that not every semiconductor device wafer 102 patterned at first lithography stage 110 need be sent to misregistration metrology system 120 for misregistration measurement.

In a preferred embodiment of the present invention, following acceptable patterning at first lithography stage 110, semiconductor device wafers 102, selected from BSDWII 104, are sent to an additional lithography stage 140 for additional patterning. It is noted that results from misregistration metrology system 120 may also be sent to additional lithography stage 140, as indicated by an arrow 142. It is appreciated that other steps, including measurements and fabrication processes, may be performed on semiconductor device wafers 102 selected from BSDWII 104 before, between and after the steps of first method 100 described hereinabove with reference to FIG. 1A.

Figure 1B:
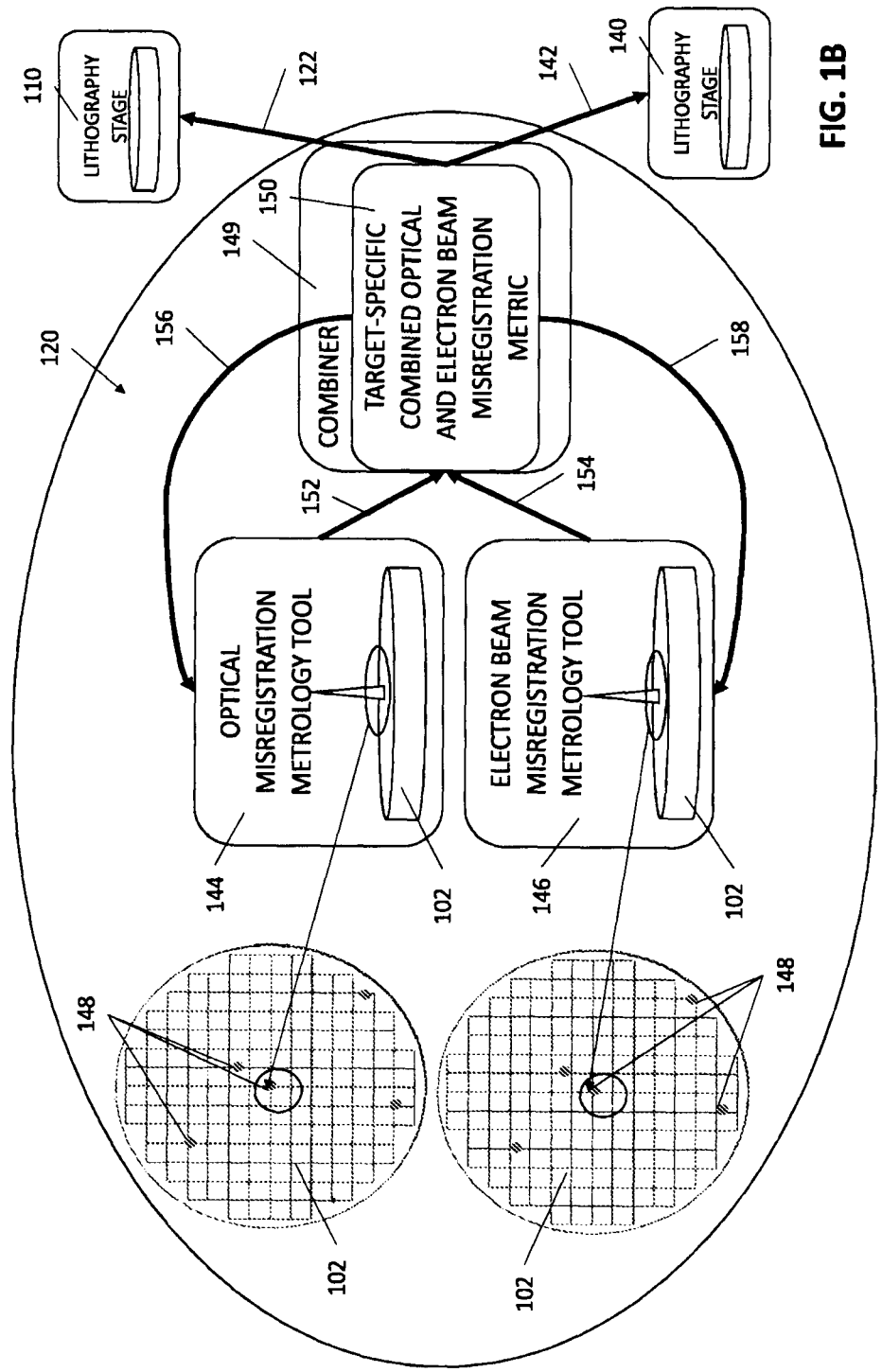
FIG. 1B is an enlargement corresponding to enlargement circle II in FIG. 1A, showing a simplified schematic pictorial illustration of a misregistration metrology system useful in the method for manufacturing semiconductor device wafers of FIG. 1A.

Turning now to FIG. 1B, which is an enlargement corresponding to enlargement circle B in FIG. 1A, showing a simplified schematic pictorial illustration of misregistration metrology system 120 useful in first method 100, it is seen that misregistration metrology system 120 includes both an optical misregistration metrology tool 144 and an electron beam misregistration metrology tool 146. It is appreciated that optical misregistration metrology tool 144 may be any suitable optical misregistration metrology tool, such as a scatterometry metrology tool or an imaging metrology tool.

A typical scatterometry metrology tool useful as optical misregistration metrology tool 144 is an ATL™ 100, commercially available from KLA-Tencor Corporation of Milpitas, Calif., USA. A typical imaging metrology tool useful as optical misregistration metrology tool 144 is an Archer™ 600, commercially available from KLA-Tencor Corporation of Milpitas, Calif., USA. A typical electron beam misregistration metrology tool 146 is an eDR7xxx™, commercially available from KLA-Tencor Corporation of Milpitas, Calif., USA.

It is appreciated that optical misregistration metrology tool 144 and electron beam misregistration metrology tool 146 are operative to measure misregistration of either the same semiconductor device wafer 102 or different ones of semiconductor device wafers 102 selected from BSDWII 104. Whether the misregistration of same or different semiconductor device wafers 102 are measured, optical misregistration metrology tool 144 and electron beam misregistration metrology tool 146 are operative to measure misregistration between the same two layers of the semiconductor device wafers 102 selected from BSDWII 104.

It is further appreciated that in a preferred embodiment of the present invention, the misregistration measurements taken by optical misregistration metrology tool 144 and by electron beam misregistration metrology tool 146 typically include multiple measurements taken at multiple sites 148 on semiconductor device water 102. However, in alternate embodiments of the present invention, the misregistration measurements taken by optical misregistration metrology tool 144 and by electron beam misregistration metrology tool 146 may include only a single measurement or multiple measurements taken at a single site 148 on a semiconductor device wafer 102.

Misregistration metrology system 120 further includes a combiner 149, which combines outputs of optical misregistration metrology tool 144 and electron beam misregistration metrology tool 146, as indicated by arrows 152 and 154, to provide a combined misregistration metric, such as a target-specific combined optical and electron beam misregistration metric (TSCOEBMM) 150.

Misregistration metrology system 120 may communicate TSCOEBMM 150 to lithography stages 110 and 140, as indicated by arrows 122 and 142, respectively, and TSCOEBMM 150 may be utilized to adjust parameters of lithography stages 110 and 140. Additionally, TSCOEBMM 150 may be utilized in the adjustment of at least one of measurement parameters and results of optical misregistration metrology tool 144, as indicated by an arrow 156. TSCOEBMM 150 may also be utilized in the adjustment of at least one of measurement parameters and results of electron beam misregistration metrology tool 146, as indicated by an arrow 158.

Figure 2A:
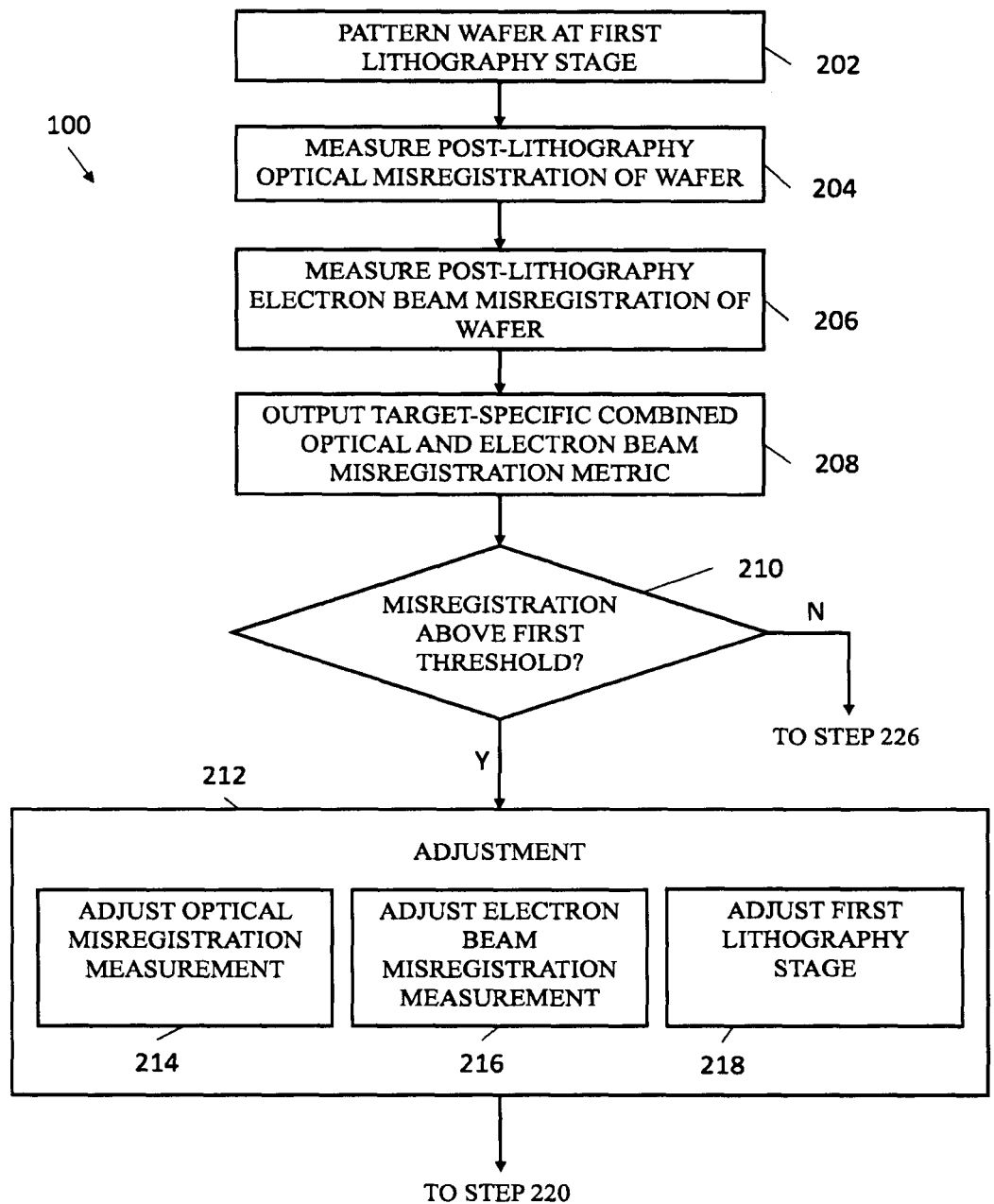
FIGS. 2A and 2B together are a simplified flowchart illustrating the first method for manufacturing semiconductor device wafers of FIGS. 1A & 1B.
Figure 2B:
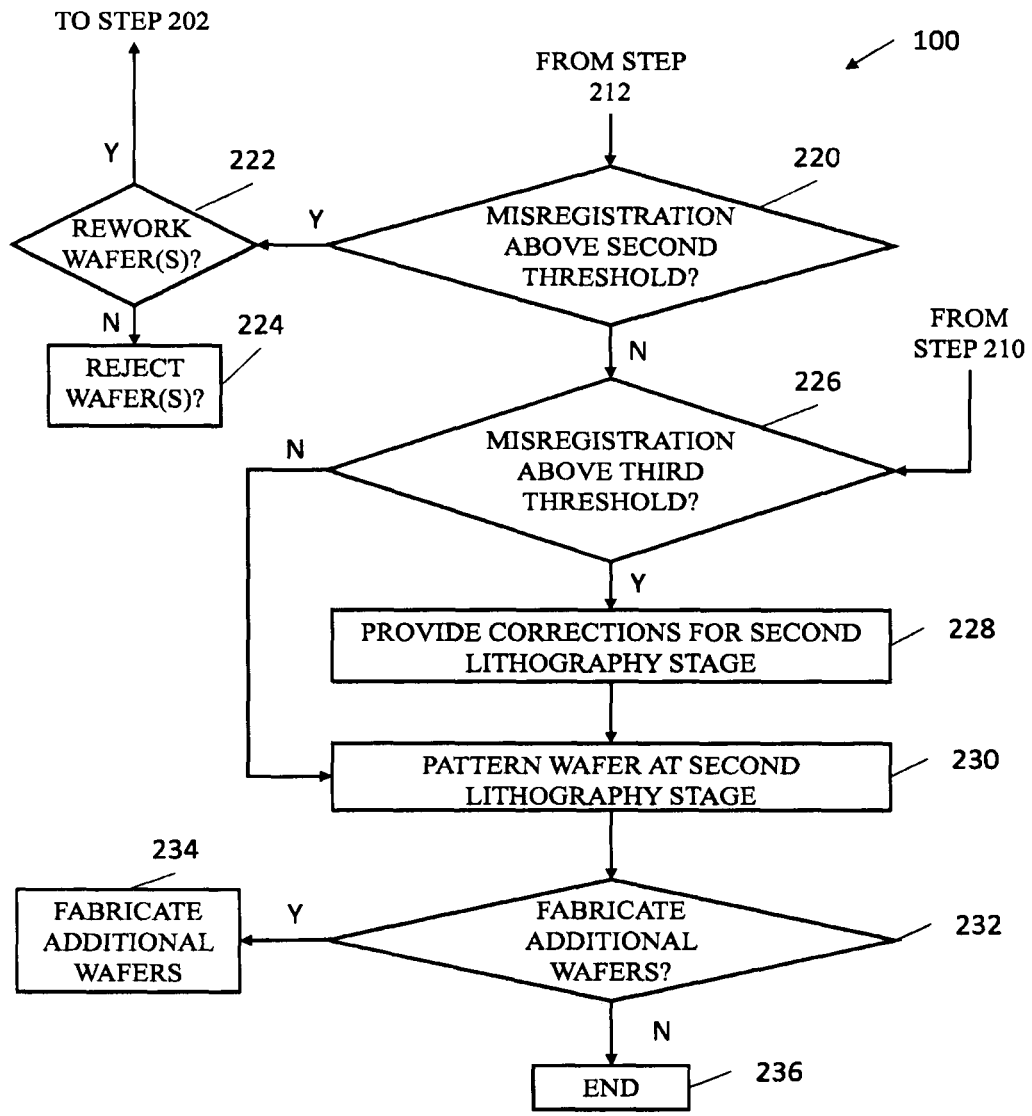

Reference is now made to FIGS. 2A & 2B, which together are a simplified flowchart illustrating first method 100 (FIGS. 1A & 1B). As seen at a first step 202, at least one semiconductor device wafer 102, selected from BSDWII 104, is patterned at first lithography stage 110. As seen at a next step 204, following patterning at first lithography stage 110, optical misregistration metrology tool 144 of misregistration metrology system 120 is utilized to measure post-lithography optical misregistration at at least one target between two layers of semiconductor device wafer 102. It is appreciated that one of the at least two layers of semiconductor device wafer 102 measured at step 204 is the layer patterned at step 202. The others of the at least two layers of semiconductor device wafer 102 measured at step 204 may be any layers formed prior to first method 100.

It is appreciated that in a preferred embodiment of the present invention, the misregistration measurement taken at step 204 typically includes multiple measurements taken at multiple sites 148 on a semiconductor device wafer 102. However, in alternate embodiments of the present invention, the misregistration measurement taken at step 204 may include only a single measurement or multiple measurements taken at a single site 148 on a semiconductor device wafer 102.

As seen at a next step 200, following patterning at first lithography stage 110, electron beam misregistration metrology tool 146 of misregistration metrology system 120 is also utilized to measure post-lithography optical misregistration at at least one target between two layers of semiconductor device wafer 102.

It is appreciated that semiconductor device wafer 102 measured at step 206 may be the same semiconductor device wafer 102 measured at step 204, but may also be a different semiconductor device wafer 102 selected from BSDWII 104.

It is further appreciated that in a preferred embodiment of the present invention, the misregistration measurement taken at step 206 includes multiple measurements taken at multiple sites 148 on a semiconductor device water 102. However, in an alternate embodiment of the present invention, the misregistration measurement taken at step 206 may include only a single measurement or multiple measurements taken at a single site 148 on semiconductor device wafer 102. It is noted that regardless of the number of measurements taken or the number of sites measured, at steps 204 and 206 misregistration is measured between corresponding layers of a semiconductor device wafer 102 selected from BSDWII 104 and patterned by first lithography stage 110 at step 202.

Following steps 204 and 206, as seen at a next step 208, misregistration metrology system 120 combines outputs of optical misregistration metrology tool 144 at step 204 and electron beam misregistration metrology tool 146 at step 206 to generate TSCOEBMM 150. TSCOEBMM 150 may be generated using a weighted average, regression, machine learning methods or any additional methods.

For example, at step 208, for each site 148 measured on semiconductor device wafer 102, the optical misregistration measured at step 204 and the electron beam misregistration measured at step 206 may be compared, and whichever one of the measurements taken at either step 204 or step 206 results in fewer residuals may be used as the TSCOEBMM 150 for that site 148.

In a next step 210, first method 100 ascertains if the misregistration measured at steps 204 and 206 is above a first threshold. If the misregistration measured at steps 204 and 206 is above the first threshold, first method 100 proceeds to a next step 212, at which adjustment based on TSCOEBMM 150 is performed. Step 212 includes at least one of optional sub-steps 214, 216 and 218.

At optional sub-step 214, TSCOEBMM 150 is utilized in the adjustment of at least one of measurement parameters and results of optical misregistration metrology tool 144. For example, measurement parameters of optical misregistration metrology tool 144, such as region of interest at which misregistration is measured, wavelength of light utilized in misregistration measurement, polarization of light utilized in misregistration measurement, numerical aperture, diffraction mask and diffraction aperture may be adjusted so measurement results from optical misregistration metrology tool 144 more closely match those of electron beam misregistration metrology tool 146.

At optional sub-step 216, TSCOEBMM 150 is utilized in the adjustment of at least one of measurement parameters and results of electron beam misregistration metrology tool 146. For example, TSCOEBMM 150 may be utilized to identify and remove outlying measurement results from misregistration measurements taken by electron beam misregistration metrology tool 146 at step 206.

At optional sub-step 218, TSCOEBMM 150 is utilized in the adjustment of first lithography stage 110. For example, parameters of first lithography stage 110, including, inter alia, rotation, scaling and translation, may be adjusted.

Following step 212, first method 100 proceeds, at a next step 220, to ascertain if the misregistration measured at steps 204 and 206 is above a second threshold. If the misregistration measured at steps 204 and 206 is above the second threshold, first method 100 proceeds, at a next step 222, to determine whether or not to send one or more semiconductor device wafers 102 back for rework.

If one or more semiconductor device wafers 102 are to be reworked, the one or more semiconductor device wafers 102 are stripped and first method 100 returns to step 202 for patterning the one or more semiconductor device wafers 102 at adjusted first lithography stage 110. IT the one or more semiconductor device wafers 102 are not to be reworked, including, inter alia, a case wherein optional sub-step 218 was not performed, semiconductor device wafers 102 or entire BSDWII 104 are rejected, as seen at a next step 224.

If the misregistration is not above the second threshold, first method 100 proceeds from step 220 to a next step 226. It is noted that when the misregistration measured at steps 204 and 206 is not above the first threshold, first method 100 proceeds to step 226 from step 210, as seen in FIGS. 2A & 2B.

At step 226, first method 100 ascertains if the misregistration measured at steps 204 and 206 is above a third threshold. If the misregistration is above the third threshold, first method 100 proceeds to a next step 228, at which TSCOEBMM 150 is utilized in the adjustment of second lithography stage 140. For example, parameters of second lithography stage 140, including, inter alia, rotation, scaling and translation, may be adjusted.

Following step 228, or following step 226 when the misregistration is not above the third threshold, first method 100 proceeds to an optional next step 230, at which semiconductor device wafer or wafers 102 are patterned at second lithography stage 140. At a next step 232, a decision is made whether or not to process additional semiconductor device wafers 102, following which either additional semiconductor device wafers 102 are fabricated using at least one of adjusted lithography stages 110 and 140 at a next step 234, or first method 100 ends, as seen at a next step 236.

It is appreciated that additional semiconductor device wafers 102 fabricated at step 234 may be fabricated using first method 100 or any other suitable alternative method, which includes first lithography stage 110 and optionally any of optical misregistration metrology tool 144, electron beam misregistration metrology tool 146 and second lithography stage 140 that have been adjusted as part of first method 100.

It is further appreciated that other steps, including measurements and fabrication processes, may be performed on semiconductor device wafers 102 selected front BSDWII 104 before, between and after the steps of first method 100 described hereinabove with reference to FIGS. 2A & 2B.

Figure 3A:
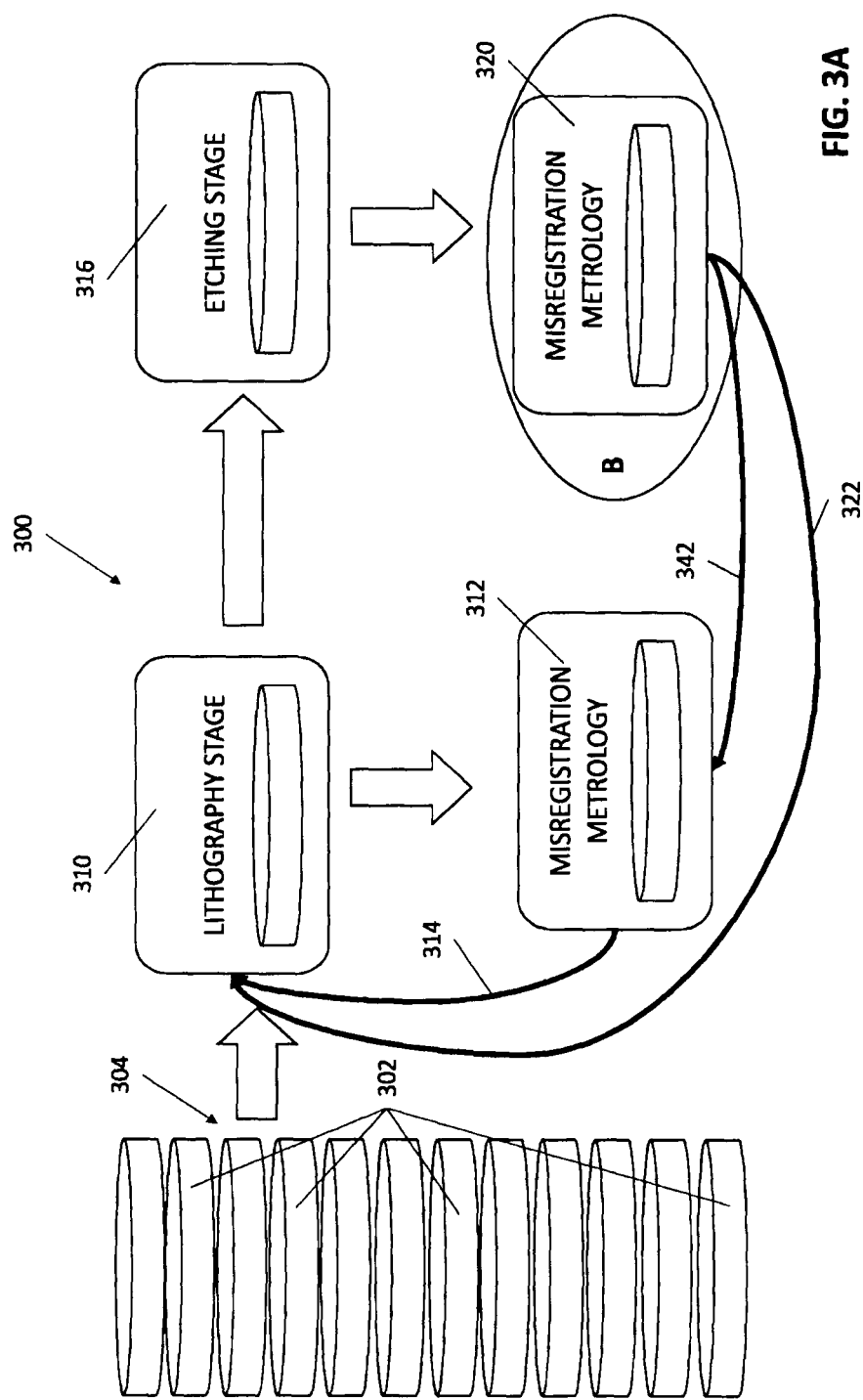
FIG. 3A is a simplified schematic pictorial illustration of a second method for manufacturing semiconductor device wafers.

Reference is now made to FIG. 3A, which is a simplified schematic drawing of a second method 300 for manufacturing semiconductor device wafers. As seen in FIG. 3A, at least one semiconductor device wafer 302, selected from a batch of semiconductor device wafers, which are intended to be identical (BSDWII) 304, is patterned at a lithography stage 310. It is appreciated that although BSDWII 304 is drawn with twelve semiconductor device wafers 302, BSDWII 304 may include any number of semiconductor device wafers 302 that is greater than or equal to one.

After patterning at lithography stage 310, semiconductor device wafer 302 is optionally measured by a misregistration metrology tool 312. Misregistration metrology tool 312 may be any suitable misregistration metrology tool, including misregistration metrology system 120 as described hereinabove with reference to FIGS. 1A & 1B, an optical misregistration metrology tool, such as a scatterometry metrology tool or an imaging metrology tool, and an electron beam misregistration metrology tool.

A typical scatterometry metrology tool useful as misregistration metrology tool 312 is an ATL™ 100, commercially available from KLA-Tencor Corporation of Milpitas, Calif., USA. A typical imaging metrology tool useful as misregistration metrology tool 312 is an Archer™ 600, commercially available from KLA-Tencor Corporation of Milpitas, Calif., USA. A typical electron beam misregistration metrology tool useful as misregistration metrology tool 312 is an eDR7xxx™, commercially available from KLA-Tencor Corporation of Milpitas, Calif., USA.

As indicated by an arrow 314, results from measurement by misregistration metrology tool 312 may be sent to lithography stage 310 for patterning either of additional ones of semiconductor device wafers 302, selected from BSDWII 304, or re-patterning of the semiconductor device wafer 302 that had been previously patterned. It is appreciated that not every semiconductor device wafer 302 patterned at lithography stage 310 need be sent to misregistration metrology tool 312 for misregistration measurement.

Following acceptable patterning at lithography stage 310, semiconductor device wafers 302 selected from BSDWII 304 are sent to an etching stage 316 for etching. Following etching stage 316, semiconductor device wafer 302 is optionally measured by a misregistration metrology system 320, and, as indicated by an arrow 322, results from measurement by misregistration metrology system 320 may be sent to lithography stage 310 for patterning additional ones of semiconductor device wafers 302 selected from BSDWII 304. Results from misregistration metrology system 320 may also be sent to misregistration metrology tool 312, as indicated by an arrow 342. It is appreciated that not every semiconductor device wafer 102 patterned at first lithography stage 110 need be sent to misregistration metrology system 120 for misregistration measurement.

It is appreciated that other steps, including measurements and fabrication processes, may be performed on semiconductor device wafers 302 selected from BSDWII 304 before, between and after the steps of second method 300 described hereinabove with reference to FIG. 3A.

Figure 3B:
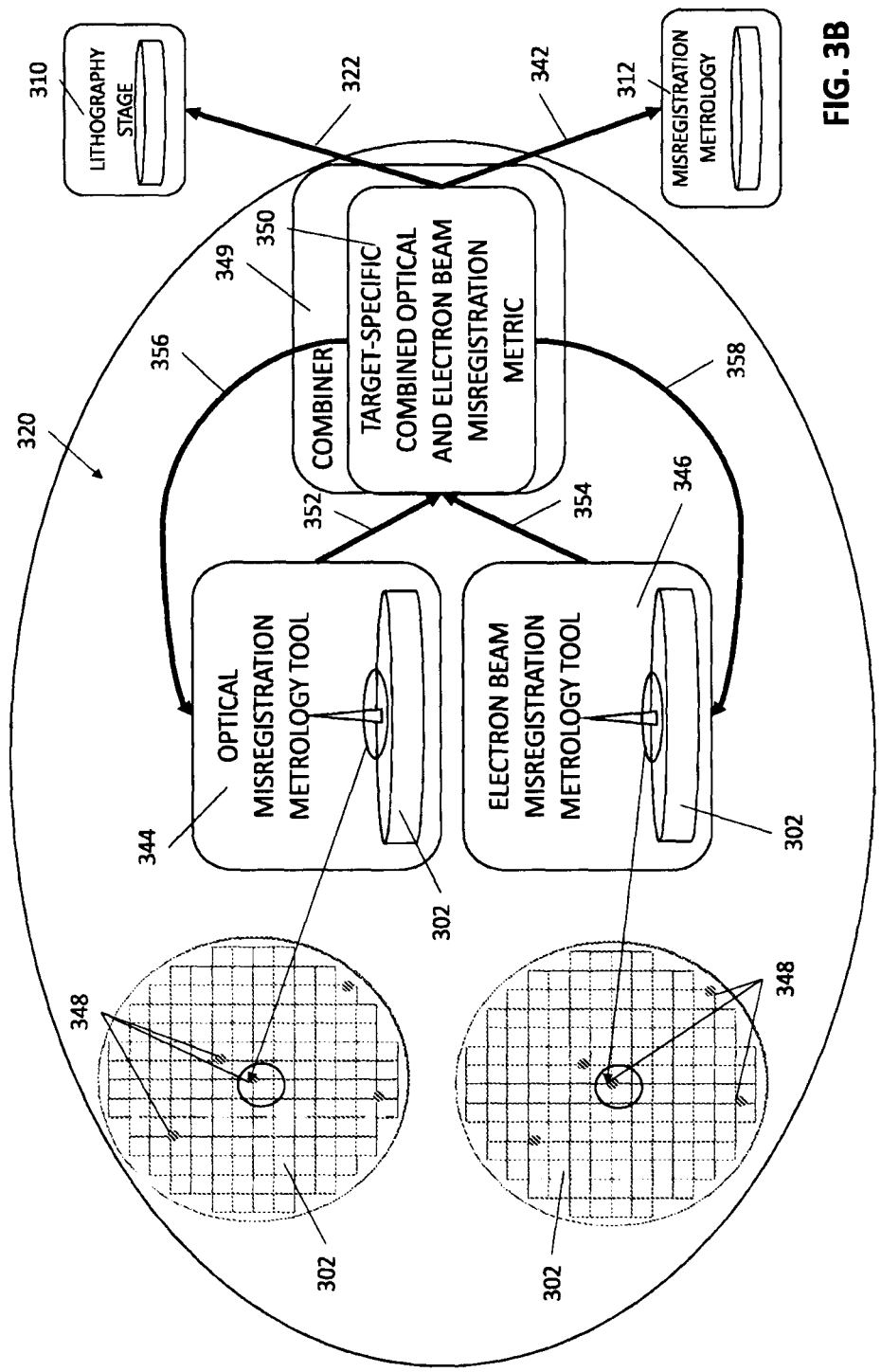
FIG. 3B is an enlargement corresponding to enlargement circle B in FIG. 3A, showing a simplified schematic pictorial illustration of a misregistration metrology system useful in the method for manufacturing semiconductor device wafers of FIG. 3A.

Reference is now made to FIG. 3B, which is an enlargement corresponding to enlargement circle B in FIG. 1A, showing a simplified schematic drawing of misregistration metrology system 320 useful in second method 300. As seen in FIG. 3B, misregistration metrology system 320 includes both an optical misregistration metrology tool 344 and an election beam misregistration metrology tool 346. It is appreciated that optical misregistration metrology tool 344 may be any suitable optical misregistration metrology tool, such as a scatterometry metrology tool or an imaging metrology tool.

A typical scatterometry metrology tool useful as optical misregistration metrology tool 344 is an ATL™ 100, commercially available from KLA-Tencor Corporation of Milpitas, Calif., USA. A typical imaging metrology tool useful as optical misregistration metrology tool 344 is an Archer™ 600, commercially available from KLA-Tencor Corporation of Milpitas, Calif., USA. A typical electron beam misregistration metrology tool 346 is an eDR7xxx™, commercially available from KLA-Tencor Corporation of Milpitas, Calif., USA.

It is appreciated that optical misregistration metrology tool 344 and electron beam misregistration metrology tool 346 are operative to measure misregistration of either the same semiconductor device wafer 302 or different ones of semiconductor device wafers 302 selected from BSDWII 304. Whether the misregistration of same or different semiconductor device wafers 302 are measured, optical misregistration metrology tool 344 and electron beam misregistration metrology tool 346 are operative to measure misregistration between the same two layers of the semiconductor device wafers 302 selected from BSDWII 304.

It is further appreciated that in a preferred embodiment of the present invention, the misregistration measurements taken by optical misregistration metrology tool 344 and by electron beam misregistration metrology tool 346 typically include multiple measurements taken at multiple sites 348 on semiconductor device wafer 302. However, in alternate embodiments of the present invention, the misregistration measurements taken by optical misregistration metrology tool 344 and by electron beam misregistration metrology tool 346 may include only a single measurement or multiple measurements taken at a single site 348 on a semiconductor device wafer 302.

Misregistration metrology system 320 further includes a combiner 349, which combines outputs of optical misregistration metrology tool 344 and electron beam misregistration metrology tool 346, as indicated by arrows 352 and 354, to provide a combined misregistration metric, such as a target-specific combined optical and electron beam misregistration metric (TSCOEBMM) 350.

Misregistration metrology system 320 may communicate TSCOEBMM 350 to lithography stage 310 and to misregistration metrology tool 312, as indicated by arrows 322 and 342, respectively, and TSCOEBMM 150 may be utilized to adjust parameters of lithography stage 310 and at least one of measurement parameters and results of misregistration metrology tool 312.

Additionally, TSCOEBMM 350 may be utilized in the adjustment of at least one of measurement parameters and results of optical misregistration metrology tool 344, as indicated by an arrow 356. TSCOEBMM 350 may also be utilized in the adjustment of at least one of measurement parameters and results of electron beam misregistration metrology tool 346, as indicated by an arrow 358.

Figure 4A:
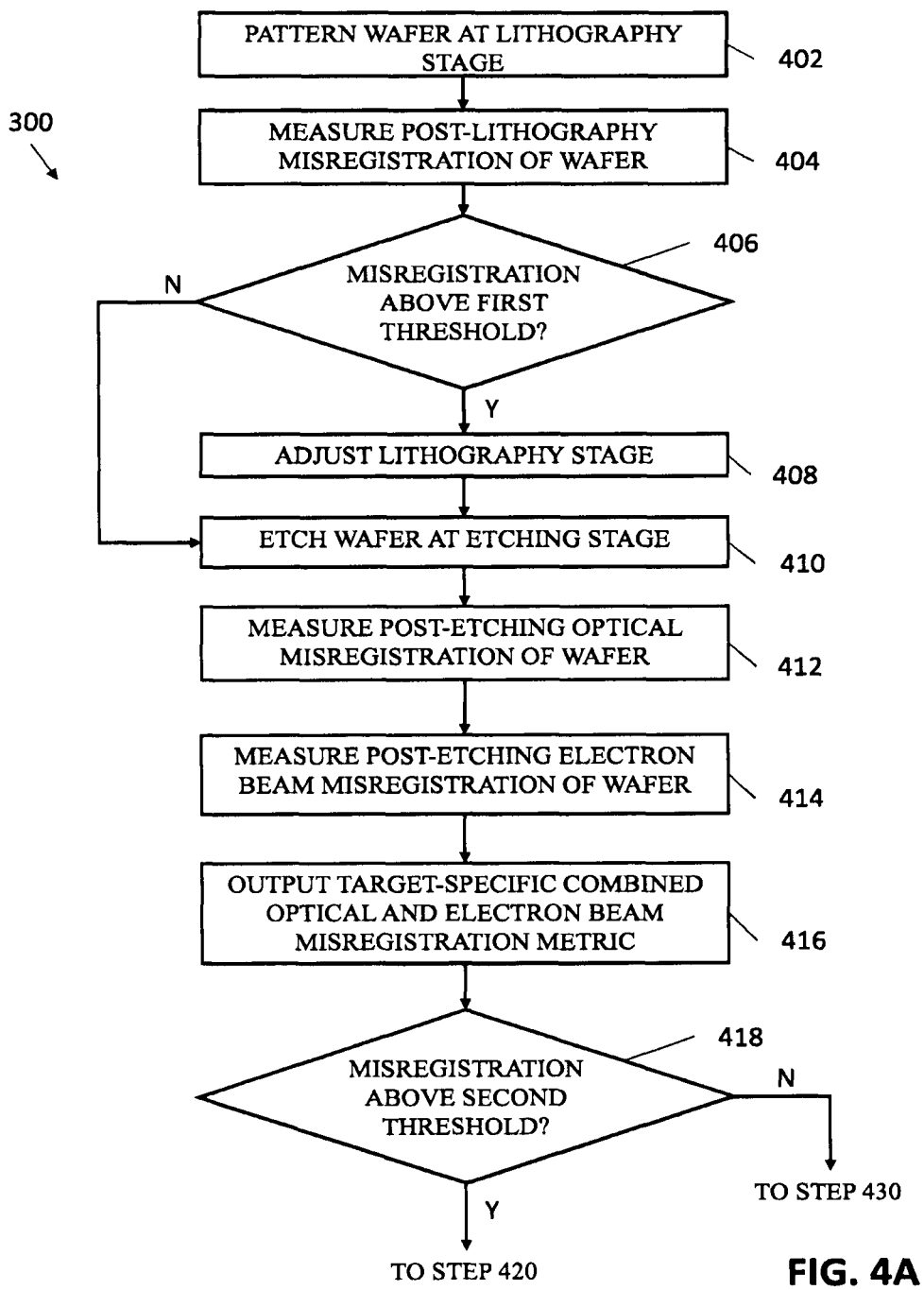
FIGS. 4A and 4B together are a simplified flowchart illustrating the second method for manufacturing semiconductor device wafers of FIGS. 3A & 3B.
Figure 4B:
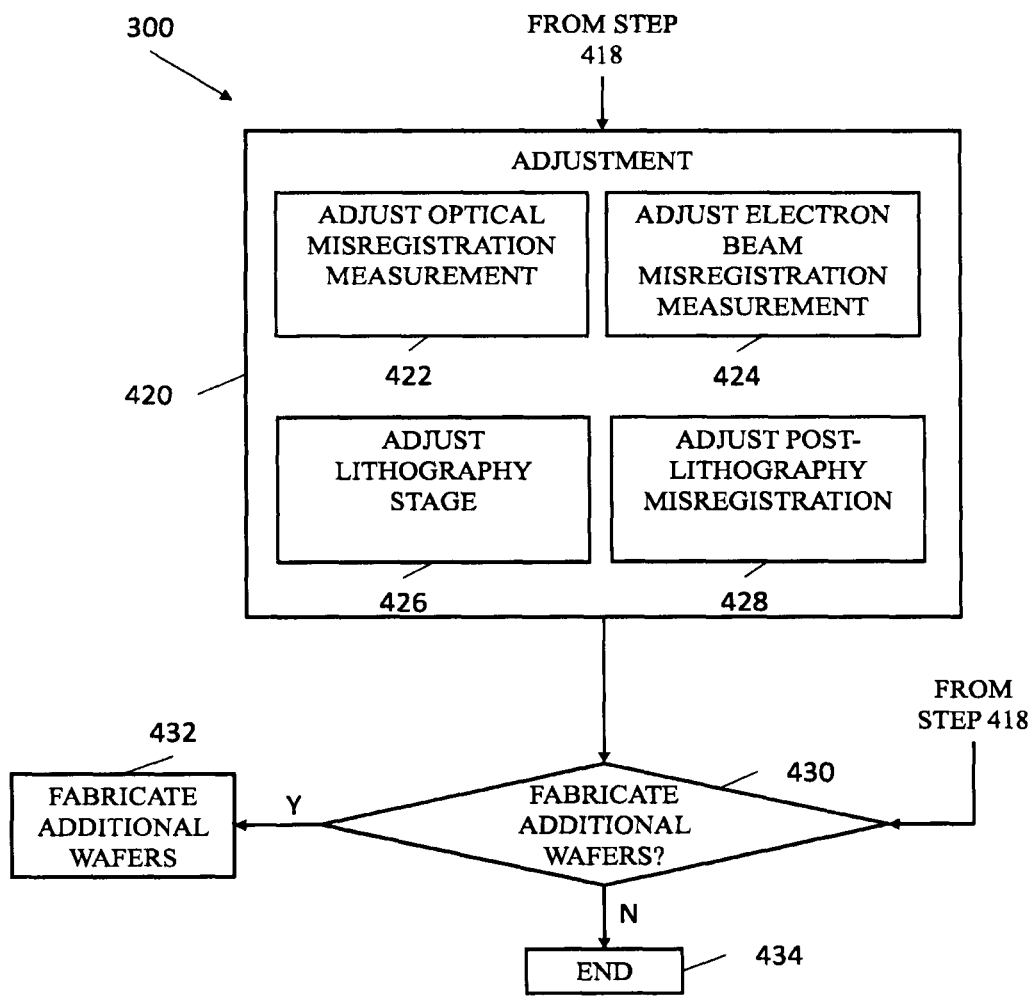

Reference is now made to FIGS. 4A & 4B, which together are a simplified flowchart illustrating second method 300 of FIGS. 3A & 3B. As seen at a first step 402, at least one semiconductor device wafer 302 selected from BSDWII 304 is patterned at lithography stage 310. As seen at a next step 404, following patterning at lithography stage 310, misregistration metrology tool 312 is utilized to measure post-lithography misregistration between two layers of semiconductor device wafer 302. It is appreciated that one of the at least two layers of semiconductor device wafer 302 measured at step 404 is the layer patterned at step 402. The others of the at least two layers of semiconductor device wafer 302 measured at step 404 may be any layers formed prior to second method 300.

It is appreciated that in a preferred embodiment of the present invention, the misregistration measurement taken at step 404 typically includes multiple measurements taken at multiple sites 348 on a semiconductor device wafer 302. However, in alternate embodiments of the present invention, the misregistration measurement taken at step 404 may include only a single measurement or multiple measurements taken at a single site 348 on a semiconductor device wafer 302.

As seen at a next step 406, second method 300 ascertains if the post-lithography misregistration measured at step 404 is above a first threshold. If the post-lithography misregistration measured at step 404 is above the first threshold, second method 300 proceeds to a next step 408, at which lithography stage 310 is adjusted based on post-lithography misregistration measured at step 404. For example, parameters of lithography stage 310, including, inter alit, rotation, scaling and translation, may be adjusted.

Following step 408 when misregistration is above the first threshold, or following step 406 when misregistration is not above the first threshold, second method 300 proceeds to a next step 410, at which semiconductor device wafer 302 is etched at etching stage 316. It is appreciated that semiconductor device wafer 302 etched at step 316 may be the same semiconductor device wafer 302 measured at step 404, but may also be a different semiconductor device wafer 302 selected from BSDWII 304 and patterned by lithography stage 310 at step 402.

As seen at a next step 412, following etching at step 410, optical misregistration metrology tool 344 of misregistration metrology system 320 is utilized to measure post-etching optical misregistration between two layers of semiconductor device wafer 302. It is appreciated that in a preferred embodiment of the present invention, the misregistration measurement taken at step 412 typically includes multiple measurements taken at multiple sites 348 on a semiconductor device wafer 302. However, in alternate embodiments of the present invention, the misregistration measurement taken at step 412 may include only a single measurement or multiple measurements taken at a single site 348 on a semiconductor device wafer 302.

As seen at a next step 414, following etching at etching stage 316, post-etching misregistration between two layers of semiconductor device wafer 302 is also measured by electron beam misregistration metrology tool 346 of misregistration metrology system 320. It is appreciated that semiconductor device wafer 302 measured at step 414 may be the same semiconductor device wafer 302 measured at step 412, hut may also be a different semiconductor device wafer 302 selected from BSDWII 104 and patterned by lithography stage 310 at step 402.

It is further appreciated that in a preferred embodiment of the present invention, the misregistration measurement taken at step 414 includes multiple measurements taken at multiple sites 348 on a semiconductor device wafer 302, However, in an alternate embodiment of the present invention, the misregistration measurement taken at step 414 may include only a single measurement or multiple measurements taken at a single site 348 on semiconductor device wafer 302, It is noted that regardless of the number of measurements taken or of the number of sites measured, at steps 412 and 414 misregistration is measured between corresponding layers of a semiconductor device wafer 302 selected from BSDWII 304.

Following steps 412 and 414, as seen at a next step 416, misregistration metrology system 320 outputs TSCOEBMM 350. It is appreciated that TSCOEBMM 350 is generated from measurements from both optical misregistration metrology tool 344 at step 412 and electron beam misregistration metrology tool 346 at step 414, TSCOEBMM 350 may be generated using a weighted average, regression, machine learning methods or any additional methods.

For example, at step 416, for each site 348 measured on semiconductor device wafer 302, the optical misregistration measured at step 412 and the electron beam misregistration measured at step 414 may be compared, and whichever one of the measurements taken at either step 412 or step 414 results in fewer residuals may be used as the TSCOEBMM 350 for that site 348.

At a next step 418, second method 300 ascertains if the misregistration measured at steps 412 and 414 is above a second threshold. If the misregistration is above the second threshold, second method 300 proceeds to a next step 420, at which adjustment based on TSCOEBMM 350 is performed. Step 420 includes at least one of optional sub-steps 422, 424, 426 and 428.

At optional sub-step 422, TSCOEBMM 350 is utilized in the adjustment of at least one of measurement parameters and results of optical misregistration metrology tool 344. For example, measurement parameters of optical misregistration metrology tool 344, such as region of interest at which misregistration is measured, wavelength of light utilized in misregistration measurement, polarization of light utilized in misregistration measurement, numerical aperture, diffraction mask and diffraction aperture may be adjusted so measurement results from optical misregistration metrology tool 344 more closely match those of electron beam misregistration metrology tool 346.

At optional sub-step 424, TSCOEBMM 350 is utilized in the adjustment of at least one of measurement parameters and results of electron beam misregistration metrology tool 346. For example, TSCOEBMM 350 may be utilized to identify and remove outlying measurement results from misregistration measurements taken by electron beam misregistration metrology tool 346 at step 414.

At optional sub-step 426, TSCOEBMM 150 is utilized in the adjustment of lithography stage 310. For example, parameters of first lithography stage 310, including, inter alia, rotation, scaling and translation, may be adjusted.

At optional sub-step 428, TSCOEBMM 150 is utilized in the adjustment of at least one of measurement parameters and results of the post-lithography misregistration measurement taken by misregistration metrology tool 312 at step 404. For example, measurement parameters of misregistration metrology tool 312, such as region of interest at which misregistration is measured, wavelength of light utilized in misregistration measurement, polarization of light utilized in misregistration measurement, numerical aperture, diffraction mask and diffraction aperture may be adjusted. As an additional example, TSCOEBMM 350 may be utilized to identify and remove outlying measurement results from misregistration measurements taken by misregistration metrology tool 312 at step 404.

Following step 420, as seen at a next step 430, a decision is made whether or not to process additional semiconductor device wafers 302, following which either additional semiconductor device wafers 302 are fabricated at a next step 432 or second method 300 ends, as seen at a step 434.

It is noted that when the misregistration measured in steps 412 and 414 is not above the second threshold, second method 300 proceeds directly from step 418 to step 430, as seen in FIGS. 4A & 4B.

It is appreciated that additional semiconductor device wafers 302 fabricated at step 432 may be fabricated using second method 300 or any other suitable alternative method, which includes lithography stage 310 and optionally any of misregistration metrology tool 312, optical misregistration metrology tool 344 and electron beam misregistration metrology tool 346 that have been adjusted as part of second method 300.

It is further appreciated that other steps, including measurements and fabrication processes, may be performed on semiconductor device wafers 302 selected from BSDWII 304 before, between and after the steps of second method 300 described hereinabove with reference to FIGS. 4A & 4B.

Reference is now made to FIGS. 5A-5D, which are simplified illustrations showing four alternative embodiments of a first hybrid target 500 formed on two separate layers of a semiconductor device wafer 502, such as semiconductor device wafer 102 (FIGS. 1A-2B) or semiconductor device wafer 302 (FIGS. 3A-4B). First hybrid target 500 is useful in first and second methods 100 and 300 for manufacturing semiconductor device wafers.

As seen in FIGS. 5A-5D, first hybrid target 500 includes a first periodic structure 504 formed on a first layer 506 of semiconductor device wafer 502 and a second periodic structure 508 formed on a second layer 509 of semiconductor device wafer 502.

As seen further in FIGS. 5A-5D, first hybrid target 500 includes first and second optically sensible regions 510 and 512 and a separate electron beam sensible region 518, preferably located therebetween. It is appreciated that optically sensible regions 510 and 512 are particularly suitable for optical metrology and electron beam sensible region 518 is particularly suitable for electron beam metrology.

It is appreciated that first and second layers 506 and 509 of semiconductor device wafer 502 may be adjacent to one another, but need not be. It is further appreciated that first and second optically sensible regions 510 and 512 are operative to indicate misregistration between first and second layers 506 and 509 of semiconductor device wafer 502 when measured by a suitable imaging misregistration metrology tool, such as an Archer™ 600, commercially available from KLA-Tencor Corporation of Milpitas, Calif., USA, using an imaging algorithm, such as the one described in U.S. Pat. No. 8,330,281, the disclosure of which is hereby incorporated by reference.

Electron beam sensible region 518 is operative to indicate misregistration between first and second layers 506 and 509 of semiconductor device water 502 when measured by a suitable electron beam misregistration metrology tool, such as an eDR7xxx™, commercially available from KLA-Tencor Corporation of Milpitas, Calif., USA, using a scatterometry algorithm, such as the one described in U.S. patent application Ser. No. 15/979,336 entitled OVERLAY MEASUREMENTS OF OVERLAPPING TARGET STRUCTURES BASED ON SYMMETRY OF SCANNING ELECTRON BEAM SIGNALS, filed May 14, 2018, the disclosure of which is hereby incorporated by reference.

On first layer 506 of semiconductor device wafer 502, first optically sensible region 510 is formed with first periodic structure 504, shown here as a grating including lines 522 and spaces 524 having a pitch A of between 600-2400 nm along an axis 530. On second layer 509 of semiconductor device water 502, second optically sensible region 512 is formed with second periodic structure 508, shown here as a grating including lines 532 and spaces 534 having a pitch B of between 600-2400 nm along an axis parallel to axis 530. Widths of lines 522 and 532 are preferably between 20-80% of pitches A and B, respectively.

As seen in the embodiment illustrated in FIG. 5A, first and second periodic structures 504 and 508 of first and second optically sensible regions 510 and 512 are partially overlapping in electron beam sensible region 518. It is noted that first and second periodic structures 504 and 508 of optically sensible regions 510 and 512 are arranged with respect to one another in such a manner that in electron beam sensible region 518, various pairs of lines 522 and 532 are partially overlapping by different extents. For example, in electron beam sensible region 518, various pairs of lines 522 and 532 may overlap by extents of $$\frac{A}{4} + \frac{A}{8}, \frac{A}{4} - \frac{A}{8}, -\frac{A}{4} + \frac{A}{8} \text{ and } -\frac{A}{4} - \frac{A}{8}.$$

As seen in the embodiments illustrated in FIGS. 5B-5D, first and second periodic structures 504 and 508 of first and second optically sensible regions 510 and 512 are not present in electron beam sensible region 518. Instead, on first layer 506 of semiconductor device wafer 502, electron beam sensible region 518 is formed with a third periodic structure 540, shown here as a grating including lines 542 and spaces 544 having a pitch C of between 30-600 nm and preferably between 30-200 nm along an axis parallel to axis 530. On second layer 509 of semiconductor device wafer 502, electron beam sensible region 518 is formed with a fourth periodic structure 550, shown here as a grating including lines 552 and spaces 554 having a pitch D of between 30-600 nm and preferably between 30-200 nm along an axis parallel to axis 530. Widths of lines 542 and 552 are preferably between 20-80% of pitches C and D, respectively. It is noted that third and fourth periodic structures 540 and 550 are partially overlapping in electron beam sensible region 518.

It is noted that in the embodiment described with reference to FIG. 5A, first and second periodic structures 504 and 508 are arranged with respect to one another in such a manner that various pairs of lines 522 and 532 are partially overlapping by different extents. Similarly, in the embodiment described with reference to FIGS. 5B-5D, third and fourth periodic structures 540 and 550 are arranged with respect to one another in such a manner that various pairs of lines 542 and 552 are partially overlapping by different extents However, it is appreciated that there is no set relationship required between pitches A, B, C and D or widths of lines 522, 532, 542 and 552.

It is further noted that periodic structures 504, 508, 540 and 550 preferably include plural periodic substructures (not shown). More specifically, lines 522, 532, 542 and 552 may be segmented, though they need not be. In an embodiment wherein lines 522, 532, 542 and 552 are segmented, each one of lines 522, 532, 542 and 552 is defined by a plurality of sub-lines and sub-spaces between sub-lines.

Reference is now made to FIGS. 6A-6D, which are simplified illustrations showing four alternative embodiments of a second hybrid target 600 formed on two separate layers of a semiconductor device wafer 602, such as semiconductor device wafer 102 (FIGS. 1A-2B) or semiconductor device wafer 302 (FIGS. 3A-4B). Second hybrid target 600 is useful in first and second methods 100 and 300 for manufacturing semiconductor device wafers.

As seen in FIGS. 6A-6D, second hybrid target 600 includes a first periodic structure 604 formed on a first layer 606 of semiconductor device wafer 602 and a second periodic structure 608 formed on second layer 609 of semiconductor device wafer 602.

As seen further in FIGS. 6A-6D, second hybrid target 600 includes first and second optically sensible regions 610 and 612 and a separate electron beam sensible region 618, preferably located therebetween. It is appreciated that optically sensible regions 610 and 612 are particularly suitable for optical metrology and electron beam sensible region 618 is particularly suitable for electron beam metrology.

It is appreciated that first and second layers 606 and 609 of semiconductor device wafer 602 may be adjacent to one another, but need not be. It is further appreciated that first and second optically sensible regions 610 and 612 are operative to indicate misregistration between first and second layers 606 and 609 of semiconductor dev ice wafer 602 when measured by a suitable imaging misregistration metrology tool, such as an Archer™ 600, commercially available from KLA-Tencor Corporation of Milpitas, Calif., USA, using an imaging algorithm, such as the one described in U.S. Pat. No. 8,330,281, the disclosure of which is hereby incorporated by reference.

Electron beam sensible region 618 is operative to indicate misregistration between first and second layers 606 and 609 of semiconductor device wafer 602 when measured by a suitable electron beam misregistration metrology tool, such as an eDR7xxx™, commercially available from KLA-Tencor Corporation of Milpitas, Calif., USA, using an imaging algorithm, such as the one described in U.S. Pat. No. 9,093,458, the disclosure of which is hereby incorporated by reference.

On first layer 606 of semiconductor device wafer 602, first optically sensible region 610 is formed with first periodic structure 604, shown here as a grating including lines 622 and spaces 624 having a pitch E between 600-2400 nm along an axis parallel to an axis 630. On second layer 609 of semiconductor device wafer 602, second optically sensible region 612 is formed with a second periodic structure 608, shown here as a grating including lines 632 and spaces 634 having a pitch F between 600-2400 nm along axis 630. Widths of lines 622 and 632 are preferably between 20-80% of pitches E and F.

As seen in the embodiment illustrated in FIG. 6A, first and second periodic structures 604 and 608 of first and second optically sensible regions 610 and 612 extend into electron beam sensible region 618. It is noted that first and second periodic structures 604 and 608 are arranged with respect to one another in such a manner that in electron beam sensible region 618, first and second periodic structures 604 and 608 are non-overlapping.

As seen in the embodiments illustrated in FIGS. 6B-6D, first and second periodic structures 604 and 608 of first and second optically sensible regions 610 and 612 are not present in electron beam sensible region 618. Instead, on first layer 606 of semiconductor device wafer 602, electron beam sensible region 618 is formed with a third periodic structure 640, shown here as a grating including lines 642 and spaces 644 having a pitch G between 100-600 nm and preferably between 100-300 nm along an axis parallel to axis 630. On second layer 609 of semiconductor device wafer 602, electron beam sensible region 618 is formed with a fourth periodic structure 650, shown here as a grating including lines 652 and spaces 654 having a pitch H between 100-600 nm and preferably between 100-300 nm along an axis parallel to axis 630. Widths of lines 642 and 652 are preferably between 20-80% of pitches G and H, respectively.

It is noted that third and fourth periodic structures 640 and 650 of electron beam sensible region 618 are arranged with respect to one another in such a manner that third and fourth periodic structures 640 and 650 are non-overlapping. It is further noted that there is no set relationship required between pitches E, G and H or widths of lines 622, 632, 642 and 652.

It is further noted that periodic structures 604, 608, 640 and 650 preferably include plural periodic substructures (not shown). More specifically, lines 622, 632, 642 and 652 may be segmented, though they need not be. In an embodiment wherein lines 622, 632, 642 and 652 are segmented, each one of lines 622, 632, 642 and 652 is defined by a plurality of sub-lines and sub-spaces between sub-lines.

Reference is now made to FIGS. 7A-7D, which are simplified illustrations showing four alternative embodiments of a third hybrid target 700 formed on two separate layers of a semiconductor device wafer 702, such as semiconductor device wafer 102 (FIGS. 1A-2B) or semiconductor device wafer 302 (FIGS. 3A-4B). Third hybrid target 700 is useful in first and second methods 100 and 300 for manufacturing semiconductor device wafers.

As seen in FIGS. 7A-7D, third hybrid target 700 includes a first periodic structure 704 formed on first layer 706 of semiconductor device wafer 702 and a second periodic structure 708 formed on second layer 709 of semiconductor device wafer 702.

As seen further in FIGS. 7A-7D, third hybrid target 700 includes first and second optically sensible regions 710 and 712 and a separate electron beam sensible region 718, preferably located therebetween. It is appreciated that optically sensible regions 710 and 712 are particularly suitable for optical metrology and electron beam sensible region 718 is particularly suitable for electron beam metrology.

It is appreciated that first and second layers 706 and 709 of semiconductor device wafer 702 may be adjacent to one another, but need not be. It is further appreciated that first and second optically sensible regions 710 and 712 are operative to indicate misregistration between first and second layers 706 and 709 of semiconductor device wafer 702 when measured by a suitable scatterometry misregistration metrology tool, such as an ATL™ 100, commercially available from KLA-Tencor Corporation of Milpitas, Calif., USA, using a scatterometry algorithm, such as the one described in U.S. Pat. No. 7,317,531, the disclosure of which is hereby incorporated by reference.

Electron beam sensible region sensible 718 is operative to indicate misregistration between first and second layers 706 and 709 of semiconductor device wafer 702 when measured by a suitable electron beam misregistration metrology tool, such as an eDR7xxx™, commercially available from KLA-Tencor Corporation of Milpitas, Calif., USA, using a scatterometry algorithm, such as the one described in U.S. patent application Ser. No. 15/979,336 entitled OVERLAY MEASUREMENTS OF OVERLAPPING TARGET STRUCTURES BASED ON SYMMETRY OF SCANNING ELECTRON BEAM SIGNALS, filed May 14, 2018.

On first layer 706 of semiconductor device wafer 702, first and second optically sensible regions 710 and 712 are formed with first periodic structure 704, shown here as a grating including lines 722 and spaces 724 having a pitch I between 400-900 nm along an axis 730. On second layer 709 of semiconductor device wafer 702, first and second optically sensible regions 710 and 712 are formed with second periodic structure 708, shown here as a grating including lines 732 and spaces 734 having a pitch I between 400-900 nm along axis 730. Widths of lines 722 and 732 are preferably between 20-80% of pitches I and J, respectively.

As seen in the embodiment illustrated in FIG. 7A, second periodic structure 708 is present in electron beam sensible region 718. It is appreciated that in the embodiment described with reference to FIG. 7A, either one of first and second periodic structures 704 and 708 are present in electron beam sensible region 718.

Additionally, in the embodiment illustrated in FIG. 7A, a third periodic structure 740 is present in electron beam sensible region 718. Third periodic structure 740 is shown here as a grating including lines 742 and spaces 744 having a pitch K between 30-600 nm and preferably between 30-200 nm along an axis parallel to axis 730. It is noted that second and third periodic structures 708 and 740 are partially overlapping in electron beam sensible region 718.

It is noted that second and third periodic structures 708 and 740 are arranged with respect to one another in such a manner that in electron beam sensible region 718, various pairs of lines 732 and 742 are partially overlapping by different extents. For example, in electron beam sensible region 718, various pairs of lines 732 and 742 may overlap by extents of $$\frac{K}{4}+\frac{K}{8}, \frac{K}{4}-\frac{K}{8}, -\frac{K}{4}+\frac{K}{8} \text{ and } -\frac{K}{4}-\frac{K}{8}.$$

Figure 7C:
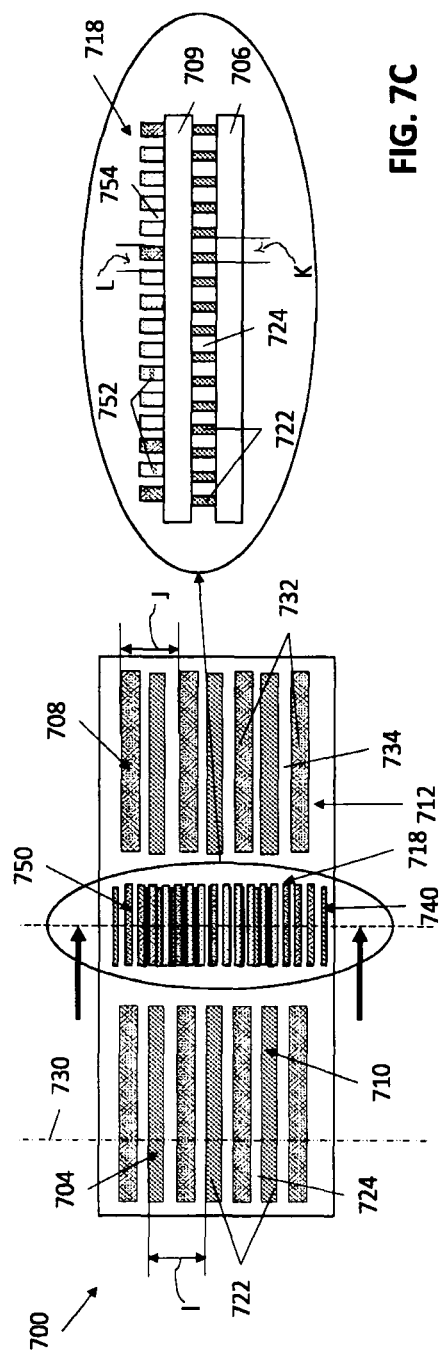
Figure 7D:
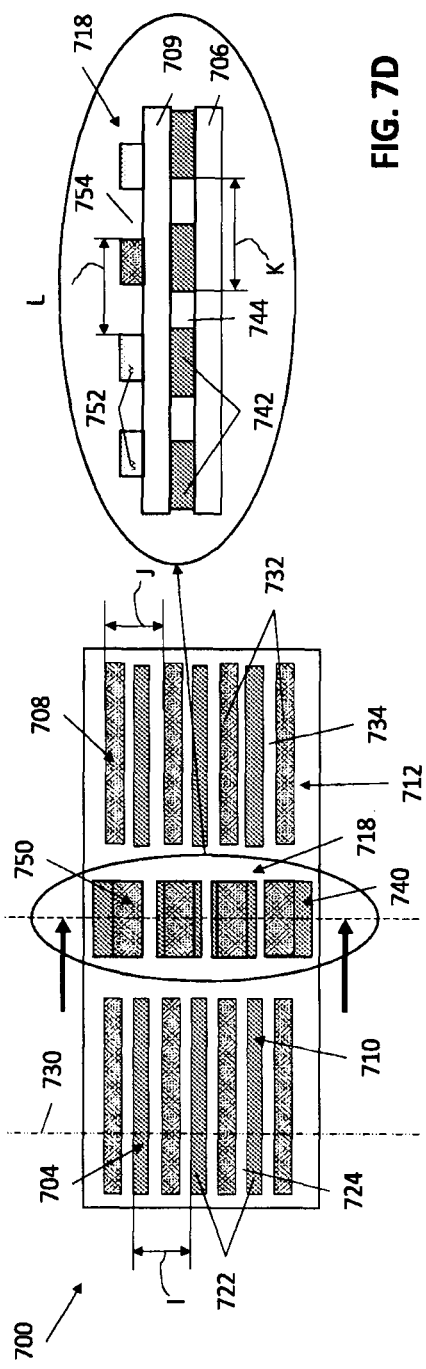

As seen in the embodiments illustrated in FIG. 7B-7D, first and second periodic structures 704 and 708 are not present in electron beam sensible region 718. Instead, on first layer 706 of semiconductor device wafer 702, electron beam sensible region 718 is formed with third periodic structure 740. On second layer 709 of semiconductor device wafer 702, electron beam sensible region 718 is formed with a fourth periodic structure 750, shown here as a grating including lines 752 and spaces 754 having a pitch L between 30-600 nm and preferably between 30-200 nm along an axis parallel to axis 730. Widths of lines 742 and 752 are preferably between 20-80% of pitches K and L, respectively, it is noted that third and fourth periodic structures 740 and 750 are partially overlapping in electron beam sensible region 718.

It is noted that in the embodiment described with reference to FIG. 7A, second and third periodic structures 708 and 740 are arranged with respect to one another in such a manner that various pairs of lines 722 and 742 are partially overlapping by different extents. Similarly, in the embodiment described with reference to FIGS. 7B-7D, third and fourth periodic structures 740 and 750 are arranged with respect to one another in such a manner that various pairs of lines 742 and 752 are partially overlapping by different extents However, it is appreciated that there is no set relationship required between pitches I, J, K and L or widths of lines 722, 732, 742 and 752.

It is further noted that periodic structures 704, 708, 740 and 750 preferably include plural periodic substructures (not shown). More specifically, lines 722, 732, 742 and 752 may be segmented, though they need not be. In an embodiment wherein lines 722, 732, 742 and 752 are segmented, each one of lines 722, 732, 742 and 752 is defined by a plurality of sub-lines and sub-spaces between sub-lines.

Reference is now made to FIGS. 8A-8D, which are simplified illustrations showing four alternative embodiments of a fourth hybrid target 800 formed on two separate layers of semiconductor device wafer 802, such as semiconductor device wafer 102 (FIGS. 1A-2B) or semiconductor device wafer 302 (FIGS. 3A-4B). Fourth hybrid target 800 is useful in first and second methods 100 and 300 for manufacturing semiconductor device wafers.

As seen in FIGS. 8A-8D, fourth hybrid target 800 includes a first periodic structure 804 formed on a first layer 806 of semiconductor device water 802 and a second periodic structure 808 formed on a second layer 809 of semiconductor device wafer 802.

As seen further in FIGS. 8A-8D, fourth hybrid target 800 includes first and second optically sensible regions 810 and 812 and a separate electron beam sensible region 818, preferably located therebetween. It is appreciated that optically sensible regions 810 and 812 are particularly suitable for optical metrology and electron beam sensible region 818 is particularly suitable for electron beam metrology.

It is appreciated that first and second layers 806 and 809 of semiconductor device wafer 802 may be adjacent to one another, but need not be. It is further appreciated that first and second optically sensible regions 810 and 812 are operative to indicate misregistration between first and second layers 806 and 809 of semiconductor device wafer 802 when measured by a suitable scatterometry misregistration metrology tool, such as an ATL™ 100, commercially available from KLA-Tencor Corporation of Milpitas, Calif., USA, using a scatterometry algorithm, such as the one described in U.S. Pat. No. 7,317,531, the disclosure of which is hereby incorporated by reference.

Electron beam sensible region 818 is operative to indicate misregistration between first and second layers 806 and 809 of semiconductor device wafer 802 when measured by a suitable electron beam misregistration metrology tool, such as an eDR7xxx™, commercially available from KLA-Tencor Corporation of Milpitas, Calif., USA, using an imaging algorithm, such as the one described in U.S. Pat. No. 9,093,458, the disclosure of which is hereby incorporated by reference.

On first layer 806 of semiconductor device water 802, first and second optically sensible regions 810 are formed with first periodic structure 804, shown here as a grating including lines 822 and spaces 824 having a pitch M between 400-900 nm along an axis 830. On second layer 809 of semiconductor device wafer 802, first and second optically sensible regions 812 are Ruined with second periodic structure 808, shown here as a grating including lines 832 and spaces 834 having a pitch N between 400-900 nm along axis 830. Widths of lines 822 and 832 are preferably between 20-80% of pitches M and N, respectively.

As seen in the embodiment illustrated in FIG. 8A, first and second periodic structures 804 and 808 of first and second optically sensible regions 810 and 812 extend into electron beam sensible region 818. It is noted that first and second periodic structures 804 and 808 are arranged with respect to one another in such a manner that in electron beam sensible region 818, first and second periodic structures 804 and 808 are non-overlapping.

As seen in the embodiments illustrated in FIGS. 8B-8D, first and second periodic structures 804 and 808 are not present in electron beam sensible region 818. Instead, on first layer 806 of semiconductor device wafer 802, electron beam sensible region 818 is formed with a third periodic structure 840, shown here as a grating including lines 842 and spaces 844 having a pitch O between 100-600 nm and preferably between 100-300 nm along an axis parallel to axis 830. On second layer 809 of semiconductor device wafer 802, electron beam sensible region 818 is formed with a fourth periodic structure 850, shown here as a grating including lines 852 and spaces 854 having a pitch P between 100-600 nm and preferably between 100-300 nm along an axis parallel to axis 830. Widths of lines 842 and 852 are preferably between 20-80% of pitches O and P, respectively.

It is noted that third and fourth periodic structures 840 and 850 of electron beam sensible region 818 are arranged with respect to one another in such a manner that third and fourth periodic structures 840 and 850 are non-overlapping. It is further noted that there is no set relationship required between pitches M, N, O and P or widths of lines 822, 832, 842 and 852.

It is further noted that periodic structures 804, 808, 840 and 850 preferably include plural periodic substructures (not shown). More specifically, lines 822, 832, 842 and 852 may be segmented, though they need not be. In an embodiment wherein lines 822, 832, 842 and 852 are segmented, each one of lines 822, 832, 842 and 852 is defined by a plurality of sub-lines and sub-spaces between sub-lines.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A misregistration metrology system useful in manufacturing semiconductor device wafers comprising:

an optical misregistration metrology tool configured to measure misregistration at at least one target between two layers of a semiconductor device which is selected from a batch of semiconductor device wafers which are intended to be identical;

an electron beam misregistration metrology tool configured to measure misregistration at said at least one target between two layers of a semiconductor device which is selected from said batch; and a combiner operative to combine said misregistration measured with said optical misregistration metrology tool and said misregistration measured with said electron beam misregistration metrology tool to provide a combined misregistration metric, wherein the combiner is configured to use a weighted average, a regression, or a machine learning method.

2. The system of claim 1, wherein said optical misregistration metrology tool comprises a scatterometry metrology tool or an imaging metrology tool.

3. The system of claim 1, wherein said optical misregistration metrology tool and said electron beam misregistration metrology tool each measure misregistration between two layers of a single semiconductor device.

4. The system of claim 1, wherein said optical misregistration metrology tool and said electron beam misregistration metrology tool each measure misregistration between two layers of different semiconductor device wafers which are both selected from said batch.

5. A method for manufacturing semiconductor device wafers comprising:

performing at least an initial stage in a lithography process on at least one semiconductor device wafer which is selected from a batch of semiconductor device wafers, which are intended to be identical;

thereafter measuring misregistration of at least two layers of at least one semiconductor device wafer, which is selected from said batch of semiconductor device wafers, which are intended to be identical by:

employing an optical misregistration metrology tool to measure misregistration at at least one target between said two layers of at least one of said at least one semiconductor device wafers, which is selected from said batch of semiconductor device wafers which are intended to be identical;

employing an electron beam misregistration metrology tool to measure misregistration at said at least one target between two layers of at least one of said at least one semiconductor device wafers which is selected from said batch of semiconductor device wafers which are intended to be identical; and combining said misregistration measured with said optical misregistration metrology tool and said misregistration measured with said electron beam misregistration metrology tool to provide a combined misregistration metric using a weighted average, a regression, or a machine learning method;

determining if said misregistration measured at said at least one target with said optical misregistration metrology tool is above a first threshold;

determining if said misregistration measured at said at least one target with said electron beam misregistration metrology tool is above said first threshold; and utilizing said combined misregistration metric for adjusting said lithography process to provide an adjusted lithography process if said misregistration measured at said at least one target with said optical misregistration metrology tool and said misregistration measured at said at least one target with said electron beam misregistration metrology tool are above said first threshold.

6. The method of claim 5, wherein said measuring misregistration includes employing said optical misregistration metrology tool and said electron beam misregistration metrology tool to measure misregistration between two layers of a single semiconductor device.

7. The method of claim 5, wherein said measuring misregistration includes employing said optical misregistration metrology tool and said electron beam misregistration metrology tool to measure misregistration between two layers of different semiconductor device wafers which are both selected from said batch.

8. The method of claim 5, further comprising utilizing said combined misregistration metric for adjusting at least one of measurement parameters, results of said optical misregistration metrology tool, or results of said electron beam misregistration metrology tool.

9. The method of claim 5, wherein said optical misregistration metrology tool comprises a scatterometry metrology tool or an imaging metrology tool.

10. The method of claim 5, wherein said performing at least an initial stage in a lithography process on at least one semiconductor device wafer comprises:
performing a lithography process on at least one semiconductor device which is selected from a batch of semiconductor device wafers, which are intended to be identical;
thereafter measuring post-lithography misregistration of at least two layers of at least one semiconductor device which is selected from said batch of semiconductor device wafers which are intended to be identical; and
thereafter performing an etching process on at least one semiconductor device which is selected from said batch of semiconductor device wafers which are intended to be identical.

11. The method of claim 10, wherein said measuring post-lithography misregistration comprises employing an optical misregistration metrology tool or an electron beam misregistration metrology tool to measure misregistration at at least one target between two layers of at least one of said at least one semiconductor device wafers which is selected from said batch of semiconductor device wafers which are intended to be identical.

12. The method of claim 10, wherein said measuring post-lithography misregistration comprises:
employing a post-lithography optical misregistration metrology tool to measure misregistration at at least one target between two layers of at least one of said at least one semiconductor device wafers which is selected from said batch of semiconductor device wafers which are intended to be identical;
employing a post-lithography electron beam misregistration metrology tool to measure misregistration at said at least one target between said two layers of at least one of said at least one semiconductor device wafers which is selected from said batch of semiconductor device wafers which are intended to be identical; and
combining outputs of said post-lithography optical misregistration metrology tool and said post-lithography electron beam misregistration metrology tool to provide a combined misregistration metric.

13. A target for use in measurement of misregistration in the manufacture of semiconductor devices, the target comprising:
a first periodic structure formed on a first layer of a semiconductor device; having a first pitch along an axis, wherein said first pitch is between 600-2400 nm; and
a second periodic structure formed on a second layer of said semiconductor device and having a second pitch along an axis parallel to said axis, wherein said second pitch is between 30-600 nm,
said target being characterized in that it includes at least one first region which is particularly suitable for optical metrology and at least one second region, separate from said at least first region, which is particularly suitable for electron beam metrology.

14. The target of claim 13, wherein in said at least one second region both said first periodic structure and said second periodic structure are present.

15. The target of claim 13, wherein in said at least one second region a third periodic structure and a fourth periodic structure are present.

16. The target of claim 13, wherein in said at least one second region one of said first and second periodic structures are present and a third periodic structure is present.

17. The target of claim 13, wherein at least one of said first and second periodic structures includes plural periodic substructures.

18. The target of claim 14, wherein in said at least one second region, said first periodic structure and said second periodic structure are non-overlapping.

19. The target of claim 15, wherein at least one of said third and fourth periodic structures includes plural periodic substructures.

20. The target of claim 15, wherein in said at least one second region, said third periodic structure and said fourth periodic structure are non-overlapping.

* * * * *